United States Patent
Pois et al.

(10) Patent No.: US 11,988,502 B2
(45) Date of Patent: May 21, 2024

(54) CHARACTERIZING AND MEASURING IN SMALL BOXES USING XPS WITH MULTIPLE MEASUREMENTS

(71) Applicant: NOVA MEASURING INSTRUMENTS INC., Freemont, CA (US)

(72) Inventors: Heath Pois, Fremont, CA (US); Wei Ti Lee, Freemont, CA (US); Laxmi Warad, Freemont, CA (US); Dmitry Kislitsyn, Fremont, CA (US); Parker Lund, Sunnyvale, CA (US); Benny Tseng, Hsinchu (TW); James Chen, Hsinchu (TW); Saurabh Singh, Freemont, CA (US)

(73) Assignee: NOVA MEASURING INSTRUMENTS INC., Fremont, CA (US)

( * ) Notice: Subject to any disclaimer, the term of this patent is extended or adjusted under 35 U.S.C. 154(b) by 0 days.

(21) Appl. No.: 18/033,324

(22) PCT Filed: Oct. 24, 2022

(86) PCT No.: PCT/IB2022/060178
§ 371 (c)(1),
(2) Date: Apr. 21, 2023

(87) PCT Pub. No.: WO2023/067580
PCT Pub. Date: Apr. 27, 2023

(65) Prior Publication Data
US 2023/0288196 A1   Sep. 14, 2023

Related U.S. Application Data

(60) Provisional application No. 63/295,478, filed on Dec. 30, 2021, provisional application No. 63/262,972, filed on Oct. 24, 2021.

(51) Int. Cl.
*G01B 15/02* (2006.01)
*G01N 23/2273* (2018.01)
*H01L 21/66* (2006.01)

(52) U.S. Cl.
CPC .......... *G01B 15/02* (2013.01); *G01N 23/2273* (2013.01); *G01B 2210/56* (2013.01);
(Continued)

(58) Field of Classification Search
CPC ................ G01B 15/02; G01B 2210/56; G01N 23/2273; G01N 2223/085;
(Continued)

(56) References Cited

U.S. PATENT DOCUMENTS 7,456,399 B1 * 11/2008 Soderstrom .......... G01N 23/223
378/50
2013/0077742 A1   3/2013 Schueler et al.
(Continued)

*Primary Examiner* — Kiet T Nguyen
(74) *Attorney, Agent, or Firm* — Reches Patents

(57) ABSTRACT

A system to characterize a film layer within a measurement box is disclosed. The system obtains a first mixing fraction corresponding to a first X-ray beam, the mixing fraction represents a fraction of the first X-ray beam inside a measurement box of a wafer sample, the measurement box represents a bore structure disposed over a substrate and having a film layer disposed inside the bore structure. The system obtains a contribution value for the measurement box corresponding to the first X-ray beam, the contribution value representing a species signal outside the measurement box that contributes to a same species signal inside the measurement box. The system obtains a first measurement detection signal corresponding to a measurement of the measurement box using the first X-ray beam. The system determines a measurement value of the film layer based on the first measurement detection signal, the contribution value, and the first mixing fraction.

17 Claims, 18 Drawing Sheets

(52) U.S. Cl.
CPC . *G01N 2223/085* (2013.01); *G01N 2223/305* (2013.01); *G01N 2223/6116* (2013.01); *G01N 2223/633* (2013.01); *G01N 2223/645* (2013.01); *H01L 22/12* (2013.01)

(58) Field of Classification Search
CPC ..... G01N 2223/305; G01N 2223/6116; G01N 2223/633; G01N 2223/645; H01L 22/12
USPC ........................................................ 250/305
See application file for complete search history.

(56) References Cited

U.S. PATENT DOCUMENTS

| | | |
|---|---|---|
| 2015/0219450 A1 | 8/2015 | Hohshi et al. |
| 2015/0247811 A1 | 9/2015 | Yun et al. |
| 2015/0316369 A1 | 11/2015 | Hohshi et al. |
| 2018/0328871 A1 | 11/2018 | Lee et al. |
| 2021/0199428 A1 | 7/2021 | Liu et al. |

* cited by examiner

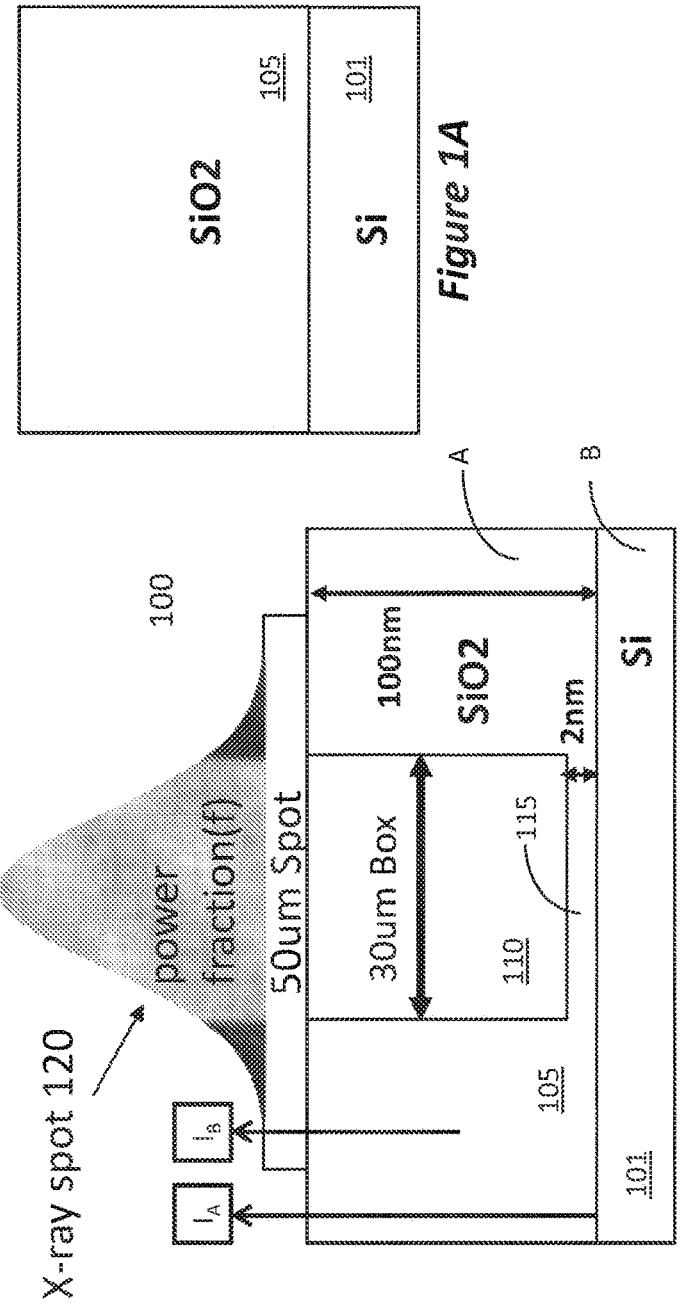
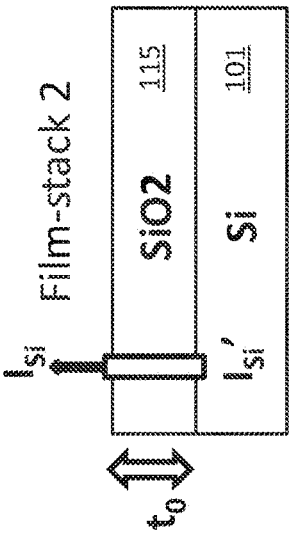
*Figure 1*
*Figure 1A*
*Figure 1B*

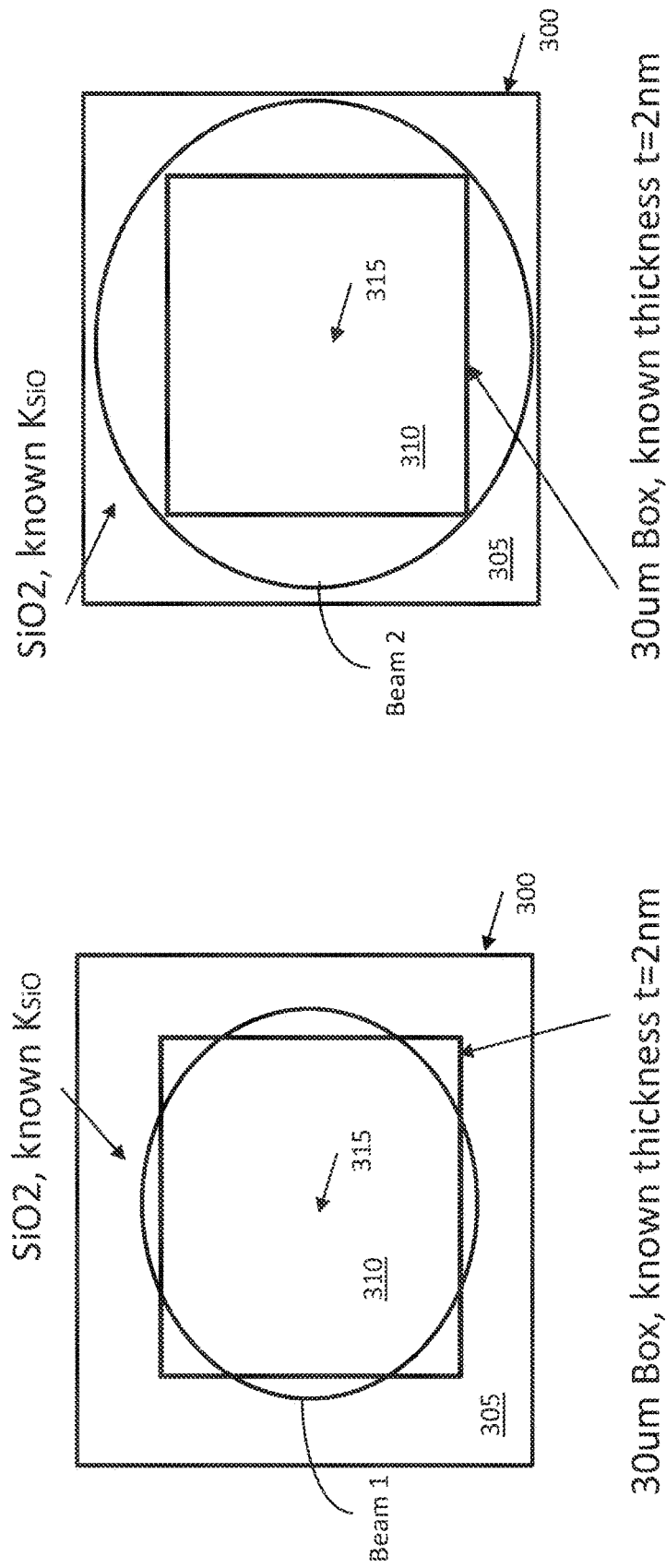

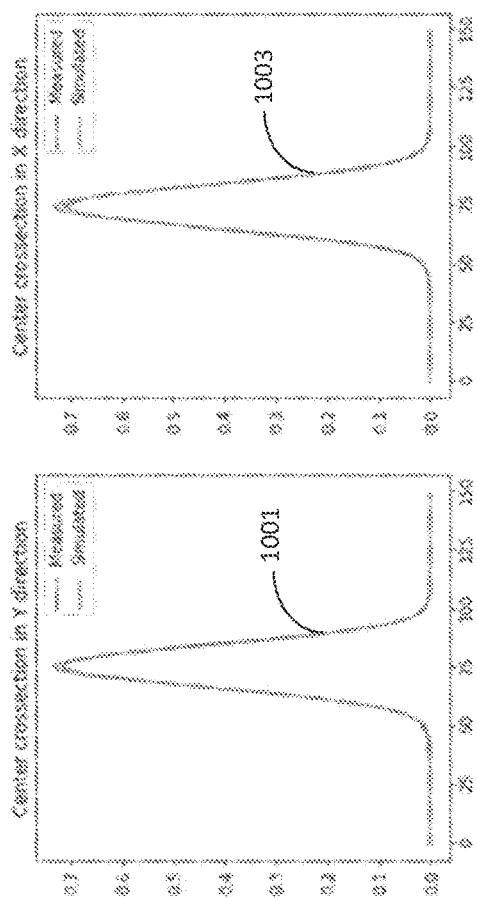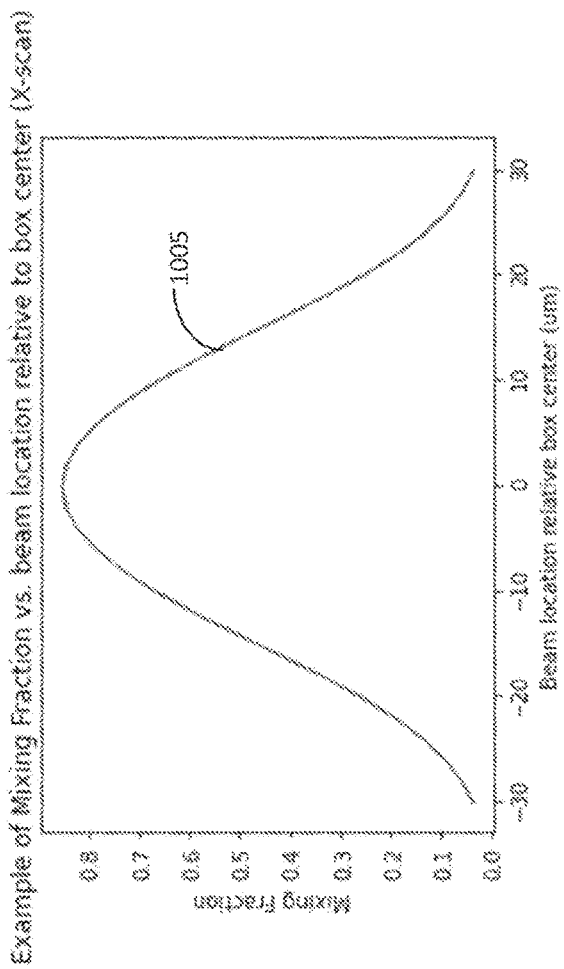
Figure 10A
Figure 10B
Figure 10C

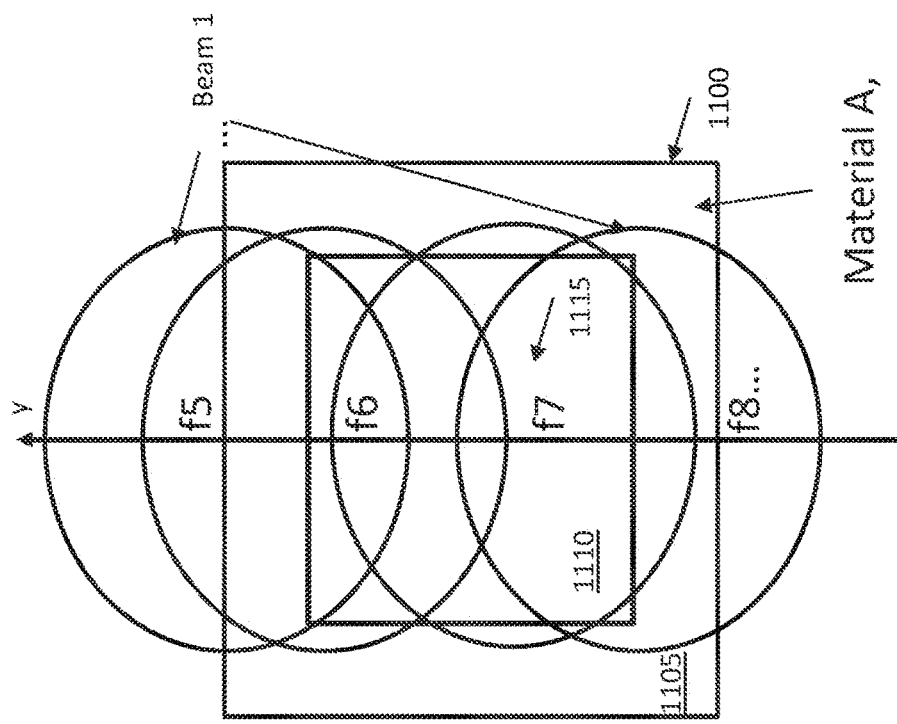
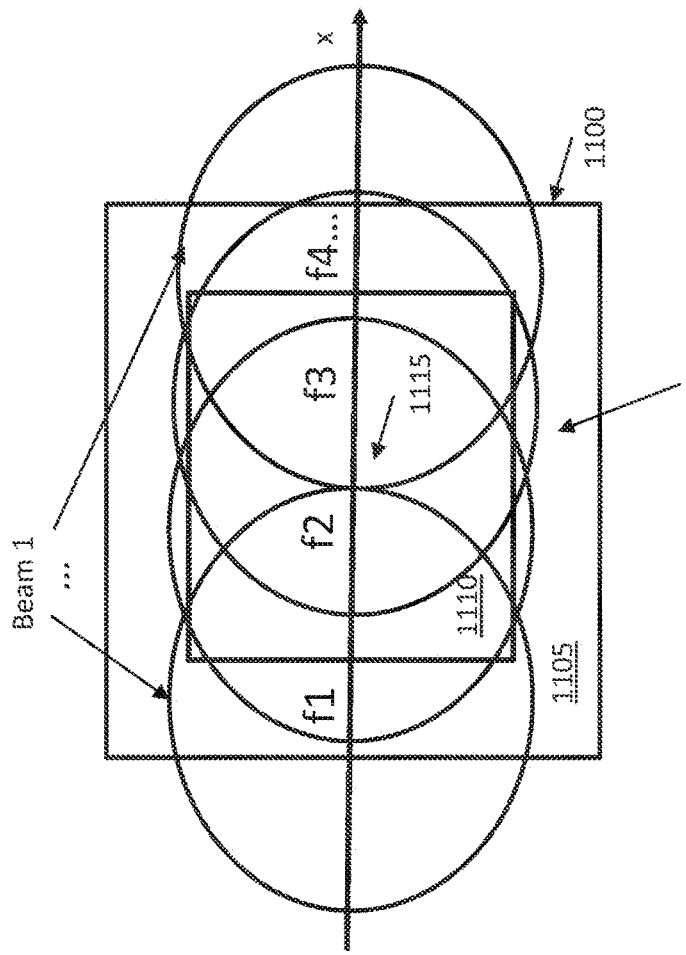
*Figure 11B*
*Figure 11A*

Illuminating, by electron optics and with a X-ray spot, a first sample region that includes the first film layer and a first sample sub-region. The first film layer is made of a first film layer material and is positioned above a substrate that is made of a substrate material. 1310

Detecting, by the electron optics, electrons emitted from the first sample region to provide detection signals. 1320

Determining, by a processor, species signals based on the detection signals, the species signals may include (i) first film layer material specie signals in an energy band corresponding to electrons emitted from the first film layer material, and (ii) substrate material species signals in an energy band corresponding to electrons emitted from the substrate material. 1330

Determining, by the processor, a measurement value of the first film layer based on (i) the species signals, (ii) mixing information (for example - f) that is indicative of a fraction of the X-ray spot that impinges on the first film layer, and (ii) a first film layer material contribution value (for example $K_{SiO}$) that represents an effective contribution of the first film layer material to at least one of the species signals. 1340

Obtaining detection signals that are indicative of electrons emitted from a first sample region as a result of an illumination, with a X-ray spot, the first sample region, wherein the first sample region comprises the first film layer and a first sample sub-region. The first film layer is made of a first film layer material and is positioned above a substrate that is made of a substrate material. 1410

Determining, by a processor, species signals based on the detection signals, the species signals may include (i) first film layer material specie signals in an energy band corresponding to electrons emitted from the first film layer material, and (ii) substrate material species signals in an energy band corresponding to electrons emitted from the substrate material. 1330

Determining, by the processor, a measurement value of the first film layer based on (i) the species signals, (ii) mixing information (for example - f) that is indicative of a fraction of the X-ray spot that impinges on the first film layer, and (ii) a first film layer material contribution value (for example $K_{SiO}$) that represents an effective contribution of the first film layer material to at least one of the species signals. 1340

Illuminating, and with a first X-ray spot of a first radius, a first sample region that includes the first film layer and a first sample sub-region. The first film layer is made of a first film layer material and is positioned above a substrate that is made of a substrate material. 1710

↓

Detecting electrons emitted from the first sample region to provide first detection signals. 1720

↓

Determining, by a processor, first species signals based on the first detection signals, the first species signals may include (i) first film layer material specie signals in an energy band corresponding to electrons emitted from the first film layer material, and (ii) substrate material species signals in an energy band corresponding to electrons emitted from the substrate material. 1730

↓

Illuminating, by electron optics and with a second X-ray spot of a second radius that differs from the first radius, the first sample region. 1740

↓

Detecting electrons emitted from the first sample region to provide second detection signals. 1750

↓

Determining, by a processor, second species signals based on the second detection signals, the first species signals may include (i) first film layer material specie signals in an energy band corresponding to electrons emitted from the first film layer material, and (ii) substrate material species signals in an energy band corresponding to electrons emitted from the substrate material. 1760

↓

Determining, by the processor the measurement value of the first film layer based on the first species signals and the second species signals. 1770

CHARACTERIZING AND MEASURING IN SMALL BOXES USING XPS WITH MULTIPLE MEASUREMENTS

FIELD OF THE DISCLOSURE

This disclosure relates generally to techniques for characterizing and measuring semiconductor structures and specifically to techniques for characterizing and measuring layers of material in small boxes using X-ray photoelectron spectroscopy (XPS) with multiple measurements.

BACKGROUND

Integrated circuits (IC) typically comprise a number of layers formed on a silicon substrate. As integrated circuits become smaller, and the thickness of layers comprising the integrated circuits is reduced, the behavior of devices formed from these layers often depends on the thickness of a specific layer. For example, a transistor formed on a silicon substrate may have different characteristics depending on the thickness of the gate of the transistor.

Layers on ICs are deposited on a substrate by a deposition technique, where patterns are etched on the layers to form various IC components. Such patterns include trenches or paddings (boxes). When the trenches or boxes are coated with additional layers of material and the trenches and boxes are small, it can become difficult to check for suitable layer thickness and verify the coating material deposited within the trenches and boxes. It may therefore be useful to determine a thickness of a film layer within a small box region.

The thickness of a film layer deposited on a substrate can be determined using one of several techniques. One technique is X-ray photoelectron spectroscopy (XPS). For XPS, XPS spectra are obtained by irradiating the substrate with a beam of X-rays, while simultaneously measuring the kinetic energy and number of electrons that escape from the top layers of the substrate.

Problem to be Solved

Since IC components are manufactured to be increasingly small, beams of X-rays for XPS methodology may not fit inside a box region. When X-ray beam with a beam size larger than the box region is used, it irradiates areas within the box and areas surrounding the box, such that the collected XPS signals are emanating from materials within and around the box. Thus, it is difficult to ascertain what part of the XPS signal corresponds to materials only from within the box. A need exists to improve the accuracy of analysis of XPS methodology for small box regions.

SUMMARY

The following summary of the disclosure is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

Disclosed embodiments enable characterizing and measuring of film layers in small boxes using XPS with multiple measurements. In some disclosed embodiments, XPS measurements are used to analyze specific properties of a film layer, e.g., thickness or composition of a film layer, within small boxes, wherein the XPS signal has some spillage outside the small boxes.

BRIEF DESCRIPTION OF THE DRAWINGS

Other aspects and features of the disclosure would be apparent from the detailed description, which is made with reference to the following drawings. It should be appreciated that the detailed description and the drawings provides various non-limiting examples of various embodiments of the disclosure, which is defined by the appended claims.

The accompanying drawings, which are incorporated in and constitute a part of this specification, exemplify the embodiments of the present disclosure and, together with the description, serve to explain and illustrate principles of the disclosure. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a partial cross-section of a wafer sample illustrating the measurements according to some embodiments;

FIG. 1A is a schematic illustrating an example of a determining of a layer thickness for a film stack outside the box structure;

FIG. 1B is a schematic illustrating an example of a determining of a layer thickness for a film stack inside the box structure;

FIG. 3A illustrates an example of measurements of a reference wafer sample using a nominal beam 1;

FIG. 3B illustrates an example of measurements of the reference wafer sample using a Beam 2 with a larger spot diameter;

FIG. 10A illustrates an example of a simulated and measured mixing fraction versus center cross section in Y direction;

FIG. 10B illustrates an example of a simulated and measured mixing fraction versus center cross in X direction;

FIG. 10C illustrates an example of mixing fraction versus beam location relative to box center for X line scan;

FIG. 11A illustrates an example of a measurement of a measurement wafer sample using X line scans;

FIG. 11B illustrates an example of a measurement of the measurement wafer sample using Y line scans;

FIG. 13 is a flow diagram illustrating an example of a method;

FIG. 14 is a flow diagram illustrating an example of a method;

FIG. 17 is a flow diagram illustrating an example of a method; and

DETAILED DESCRIPTION

Figure 2:
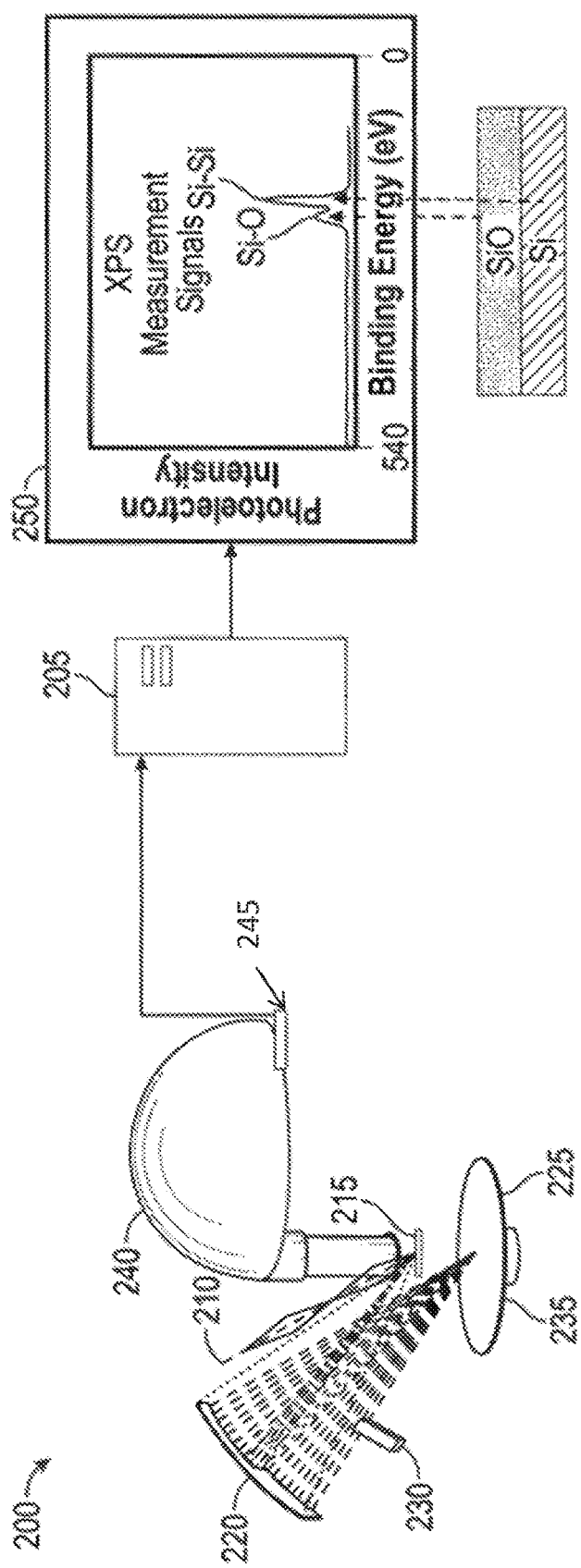
FIG. 2 illustrates an example of a measurement device.

Embodiments of the characterization and measurement method/system are described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to either one of a system, a method and a non-transitory computer readable medium should be applied mutatis mutandis to any other of the system, a method and a non-transitory computer readable medium. For example—any reference to a system should be applied mutatis mutandis to a method that can be executed by the system and to a non-transitory computer readable medium that may stores instructions executable by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any number, or value illustrated below should be regarded as a non-limiting example.

Various examples refer to a film layer made of SiO2, and to a substrate made of Si. It should be noted that these are merely non-limiting example of materials and that the film layer may be made of a material that differs from SiO2 and/or the substrate can be made of a material other than Si. Any reference to SiO2 and Si should be applied, mutatis mutandis to any film layer material and substrate material respectively.

FIG. 1 illustrates a cross-section of a part of a semiconductor wafer sample 100, demonstrating a characterization or measurement process, e.g., a process to determine the species and/or thickness of the species of a thin film layer (e.g., approx. 0-10 nm thick) on the sample. The base layer 101, e.g., a wafer substrate, is made of silicon, and a layer of an insulator 105 is formed over the base layer 101. In this example a silicon-dioxide layer is formed over the Si substrate base layer. The silicon-dioxide layer 105 is patterned by etching a bore in the shape of a square or round box 110, in this particular example having slide lengths or a diameter of 30 μm. In actual production many such bores would be formed in the insulating layer 105, but for the purpose of understanding the embodiments the description proceeds with respect to only one such bore. The bore in this example does not reach the substrate, so that a thin film of silicon-dioxide 115 remains in the bottom of the bore over the base layer 101. Although in this example of FIG. 1, a layer of silicon-dioxide 105 is formed on a silicon substrate 101 and etched to form box 110, any other material (silicon-nitride, other oxides or nitrides, etc.) or fabrication processes (e.g., selective deposition, etc.) can be used to form box 110. Box 110 can be rectangular shaped, circular shaped, trench shaped, etc. Also, an intervening layer of a different material may be present between the substrate 101 and the dielectric layer 105 in which the bore is formed.

According to one embodiment, XPS is used to characterize box 110, i.e., to determine the presence of a film layer and the composition and thickness of the film layer within (or below) box 110. Referring to the example of FIG. 1, in the embodiment XPS is used to determine whether a silicon-dioxide film layer remains at the box 110 (or below the box) and, if so, the thickness of such film layer.

In one embodiment, the sample illustrated in FIG. 1 is irradiated with x-rays and the resulting photo electron emission (illustrated by arrows) from the sample is examined. If the X-ray beam generated a spot 120 to fit within the box 110 of 30 μm, the thickness of the SiO2 layer 115 can be calculated using the attenuation of emission from the Si substrate 101, referred to herein as the Si signal, by the SiO2 layer 115. However, in this particular example, because an X-ray beam generated has a spot 120 with a diameter greater than a dimension of 30 μm, the XPS signals are spilled outside box 110. In this case, the attenuation of emission from the SiO2 has a component of signals within the box and a component of signals outside the box (e.g., spillage). According to one embodiment, multiple measurements are performed for a reference of box 110 to determine a mixing fraction of the beam (fraction of beam that is inside the box). Using the mixing fraction, multiple measurements are performed for the box 110 to determine a contribution value for species signal outside the box that contribute to a same species signal inside the box. The mixing fraction and contribution value can then be used to calculate the thickness of the SiO2 layer 115.

FIG. 2 illustrates an example of an X-ray system 200 for the various embodiments disclosed herein for characterization or measurement processes. The operation of the system and the analysis described herein may be performed by one or more computers 205. In one embodiment, computers 205 may be a standalone computer at a customer site. Computers 205 may store, in an appropriate nonvolatile computer-readable storage medium, an instruction used for the software, and may use one or more processors to execute the instruction in hardware, to implement the technology in this specification.

An electron gun 210 emits electron beam which is directed to hit an anode 215, in this example made of aluminum. Consequently, X-rays are generated at the anode and are directed towards monochromator 220. The X-rays are then diffracted at the monochromator. In this example, monochromator 220 is made of crystal quartz that is configured to focus only Al Kα X-rays onto the wafer 225. A small amount of this Al Kα can also be collected at flux detector 230. The signal of the flux detector 230 can be converted from X-ray count into a flux number. The flux number can be used as reference indicator of the X-ray hitting the wafer.

The primary Al Kα X-ray beam is directed to hit the wafer 225. As the X-ray pass through the layers of wafer 225, electrons and secondary X-rays are emitted from each of the layers of the wafer. An XPS energy analyzer 240 collects the emitted electrons and directs them towards the XPS detector 245. The XPS energy analyzer 240 generally separates the emitted electrons according to their energies, akin to a prism separating white light per photon frequencies. Consequently, the signal generated by the XPS detector 245 can be used to measure the number of electrons (i.e., intensity) at each specific energy. A sample graph generated by the computer 205 plotting intensity (number of electrons) v. binding energy is shown on monitor 250.

The plot exemplified in monitor 250 illustrates how the materials within the sample can be identified. In this particular example, the wafer 225 is made of silicon, and has a first layer of silicon-dioxide 105 or a thin film layer of silicon-monoxide 115. Various peaks in the plot can be used to identify the material present in the inspected sample, here wafer 225.

According to one embodiment, the attenuation of the XPS signal from one layer is used to deduce the presence of a layer of different material over it. Moreover, the amount of attenuation can be used to quantify the thickness of the layer above should the X-ray beam be contained within the box 110. For X-ray beam that has spillage of a species signal outside the box 110, a mixing fraction f can be used to quantify the fraction of beam inside the box (e.g., f) and the fraction of beam outside the box (e.g., 1−f) which can be used to calculate the spillage of species signal.

Turning for the specific example of FIG. 1, as exemplified in FIG. 1B, with a mixing fraction f=1, for an over-layer SiO2 of thickness $t_0$, a signal for a species S (in FIG. 1B) will be attenuated as follows: $I_{si}=I_{si}'e^{(-t0/\lambda si,SiO)}$, where $I_{si}'$ (may sometimes be referred to as reference intensity or reference electron count) is the intensity of photoelectrons from species Si prior to passing through layer SiO2, and $\lambda_{si,SiO}$ is a material parameter (effective attenuation length (EAL) for photoelectrons of a specific type from species Si passing in material SiO2, e.g., silicon 2p photoelectrons emitted from silicon and passing through SiO2. In this disclosure the shorthand EAL for material A in material B may be used, but should be understood to refer to specific photoelectrons emitted from the material). When other species exist (other than a thin layer of SiO2 and/or other than a Si substrate)—then the indices of intensities (si in the case of $I_{si}$ and/or SiO in case of $I_{SiO}$) and well as indices of other constants and variables (for example $K_{Si}$, $K_{SiO}$, $\lambda_{si,SiO}$, and/or $\lambda_{SiO}$) will be changes to reflect the different species (different materials).

Based on this above equation, as exemplified in FIG. 1B, for a beam of X-rays with a mixing fraction less than 1, species Si signal attenuation can be modeled as follows: $I_{Si}^{Model}=fe^{(-t0/\lambda si,SiO)}/K_{Si}$, where f is the mixing fraction, and $K_{Si}$ is a constant representing the effective contribution of Si to the intensity of the signal. Thus, the attentuated signal of silicon through the SiO2 overlayer is expressed as an exponent of the ratio of the thickness of the overlayer over the effective attenuation length of silicon through SiO2, scaled by a silicon scaling factor $K_{Si}$, and further scaled by a mixing fraction f.

Signal production for species SiO2 can be modeled similarly as follows: $I_{SiO}^{Model}=f(1-e^{(-t0/\lambda SiO)})/K_{SiO}$, where $K_{SiO}$ is a constant representing the effective contribution of SiO2 to the intensity of the signal, $\lambda_{SiO}$ is a material parameter (effective attenuation length (EAL) for photoelectrons of a specific type from species SiO2 passing through material SiO2. Thus, the produced signal of SiO2 from the SiO2 overlayer is expressed as a function of the ratio of the thickness of the overlayer over the effective attenuation length of silicon through SiO2, scaled by a silicon scaling factor $\lambda_{SiO}$, and further scaled by a mixing fraction f.

Turning to FIG. 1A, for a thick overlayer 105 (approximately 100 nm), the species Si signal attenuation can be approximated to be zero. That is, it is assumed that the overlayer 105 is sufficiently thick such that $I_{Si}$ is not being produced outside the box. The species SiO2 signal can be modeled as follows: $I_{SiO}^{Model}=(1-f)/K_{SiO}$. Thus, the SiO2 signal can be expressed as a SiO2 scaling factor $K_{SiO}$, and further scaled by a spillage factor (1−f).

Referring to FIG. 1 again, a wafer sample to be characterized is a substrate of material B and includes a first layer of material A with a thickness of $t_{thick}$ (e.g., approx. 100 nm in FIG. 1) forming a box thereon, and a remainder film layer of material A inside the box with a thickness of $t_{thin}$ (e.g., approx. 2 nm in FIG. 1). The photoemissions from species A and B within box 110, having intensities $I_A$ and $I_B$, will be independently attenuated by the presence of layer A, reduced by the mixing fraction representing the fraction of X-ray beam directed at species A and B within the box, and the intensities are modified by a contribution value that represents a spillage of X-ray beam outside the box. Subsequent Figures might refer to substrate as material B and overlayer as material A.

In one embodiment, the raw intensity numbers are not used directly, since there is a need to account for flux variation with each measurement and also variation from tool to tool. Therefore, the X-ray flux number may be used to normalize the raw intensity. In one embodiment, the raw intensity numbers are used directly as the species signal. In one embodiment, the value of $I_{si}'$ or $1/K_{Si}$ are known and can be used as a constant number to scale the species signal based on the requirement or experience. For example, the value of $I_{si}'$ can be obtained by performing XPS measurement of the wafer substrate prior to depositing the top layer, it may be the intensity of photoelectrons per some unit of incident x-ray flux or at some nominal flux, etc.

In some embodiments, a ratio of measured intensities ($I_{SiO}/I_{Si}$) from an XPS measurement can be compared with the total model intensities ratio ($I_{SiO}^M/I_{Si}^M$) to further characterize the sample of FIG. 1. For example, a residual function (or merit function (M)) can be determined as follows:
where $$M = \left[\left(\frac{I_{SiO}}{I_{Si}}\right) - \left(\frac{I_{SiO}^M}{I_{Si}^M}\right)\right]^2$$

$$I_{SiO}^M = f\frac{1}{K_{SiO}}\left(1 - e^{-\frac{t_0}{\lambda_{SiO}}}\right) + \frac{(1-f)}{K_{SiO}} \text{ and } I_{Si}^M = f\frac{1}{K_{Si}}e^{-\frac{t_0}{\lambda_{Si,SiO}}},$$

where M denotes a merit function, $$\frac{I_{SiO}}{I_{Si}}$$

denotes a measured intensity ratio, $$\frac{I_{SiO}^M}{I_{Si}^M}$$

denotes a modeled ratio of species intensity, $I_{Si}$ denotes a measured species intensity for Si, $I_{SiO}$ denotes a measured species intensity for SiO2, $t_0$ denotes a thickness of SiO2 film layer 115 inside box 110, $K_{Si}$ denotes a constant representing the effective contribution of Si to the intensity of the species signal, $K_{SiO}$ denotes a constant representing the effective contribution of SiO2 to the intensity of the species signal, and f denotes a mixing fraction that represents the fraction of incident beam inside box, etc.

If it is assumed that $I_{Si}$ is not being produced outside the box 110, therefore there would be no $K_{Si}$ contribution and $I_{SiO}^M$ and $I_{Si}^M$ can be approximated as follows:

$$I_{SiO}^M \approx f\left(1 - e^{-\frac{t_0}{\lambda_{SiO}}}\right) + (1-f)/K_{SiO}, \text{ and } I_{Si}^M \approx fe^{-\frac{t_0}{\lambda_{Si,SiO}}}.$$

The M function can be λ. In this example, there are more unknowns than the number of intensity ratios. Thus, we need additional data points to characterize the box 110.

In the following disclosure, multiple measurements (a first beam and a second beam) are used with a reference wafer sample to characterize the box 110 of FIG. 1, as further described in FIGS. 3-6, to solve for the multiple unknowns.

FIG. 3A illustrates a measurement characterizing a reference sample 300 using a nominal Beam 1 and FIG. 3B illustrates a measurement characterizing the reference sample 300 using a Beam 2 with a larger spot diameter according to one embodiment. Reference sample 300 can represent sample 100 of FIG. 1 having box 310 with a side length of 30 μm. Reference sample 300 has a known substrate of material Si (not shown) and a known overlayer 305 of material SiO2. Here, to increase the number of data points, Beam 1 and Beam 2 are used to character reference sample 300. The Beam 1 has a spot of 40 μm in diameter providing a first mixing fraction $f_1$ and the Beam 2 has a spot of 50 μm in diameter providing a second mixing fraction $f_2$. Further, to decrease the numbers of unknowns, the reference wafer is of a same dimension 30 μm with known species and species thickness to, e.g., a SiO2 film layer 315 with 2 nm thickness.

In one embodiment, to fabricate the sample 300 with a known thickness, the wafer sample 300 can be etched with a similar box (bore structure) having 200 μm side lengths (not shown in Figure) and characterizing the 200 μm box using a 40 μm beam provides the known thickness. Here, it is assumed the 200 μm box are etched by a similar process as the 30 μm box and both the 200 μm and 30 μm boxes have a same film layer thickness inside these boxes. Since the 40 μm beam applied to the 200 μm box should have all species signal inside the box (e.g., no spillage), the thickness can be determined by the attenuation equation $I_{si}=I_{si}'e^{(-t0/\lambda_{si,SiO})}$ as previously described.

Having a 30 μm box with a film layer of known material (SiO2) and known thickness (2 nm), a merit function to characterize sample 300 using Beam 1 can be as follows:

$$M_1(I_{Si1}, I_{SiO1}, t, K_{SiO}, f_1) = \left[\left(\frac{I_{SiO1}}{I_{Si1}}\right) - \left(\frac{I_{SiO1}^M}{I_{Si1}^M}\right)\right]^2,$$

where $M_1$ denotes a merit function for Beam 1, $$\frac{I_{SiO1}}{I_{Si1}}$$

denotes a measured intensity ratio for Beam 1, $$\frac{I_{SiO1}^M}{I_{Si1}^M}$$

denotes a modeled ratio of species intensity for Beam 1, measured $I_{Si1}$ denotes a measured species intensity for Si using Beam 1, $I_{SiO1}$ denotes a measured species intensity for SiO2 using Beam 1, t denotes a thickness of SiO2 film layer 315 inside box 310, $K_{SiO}$ denotes a constant representing the effective contribution of SiO2 to the intensity of the species signal, and $f_1$ denotes the first mixing fraction.

The merit function to characterize sample 300 using Beam 2 can be as follows:

$$M_2(I_{Si2}, I_{SiO2}, t, K_{SiO}, f_2) = \left[\left(\frac{I_{SiO2}}{I_{Si2}}\right) - \left(\frac{I_{SiO2}^M}{I_{Si2}^M}\right)\right]^2,$$

where $M_2$ denotes a merit function for Beam 2, $$\frac{I_{SiO2}}{I_{Si2}}$$

denotes a modeled ratio of species intensity for Beam 2, $$\frac{I_{SiO2}^M}{I_{Si2}^M}$$

denotes a modeled ratio of species intensity for Beam 2, $I_{Si2}$ denotes a measured species intensity for Si using Beam 2, $I_{SiO2}$ denotes a measured species intensity for SiO2 using Beam 2, t denotes a thickness of SiO2 film layer 315 inside box 310, $K_{SiO}$ denotes a constant representing the effective contribution of SiO2 to the intensity of the species signal, and $f_2$ denotes the second mixing fraction. (Note that, in the merit function, the notation SiO1 and SiO2 indicates silicon dioxide signal obtained from beam 1 and beam 2, not silicon monoxide and silicon dioxide).

Referring to the first and second merit functions ($M_1$, $M_2$), the known values are the species signals $I_{Si1}$, $I_{SiO1}$ (first measurement using Beam 1), the species signals $I_{Si2}$, $I_{SiO2}$ (second measurement using Beam 2), t, and $K_{SiO}$. The unknown values are the mixing fractions $f_1$ and $f_2$. Since there are two equations with two unknowns, the mixing fractions $f_1$ and $f_2$ can be independently calculated using the merit functions $M_1$, $M_2$. In another embodiment, the mixing fractions can be calculated using the merit functions by a regression technique.

Figure 4B:
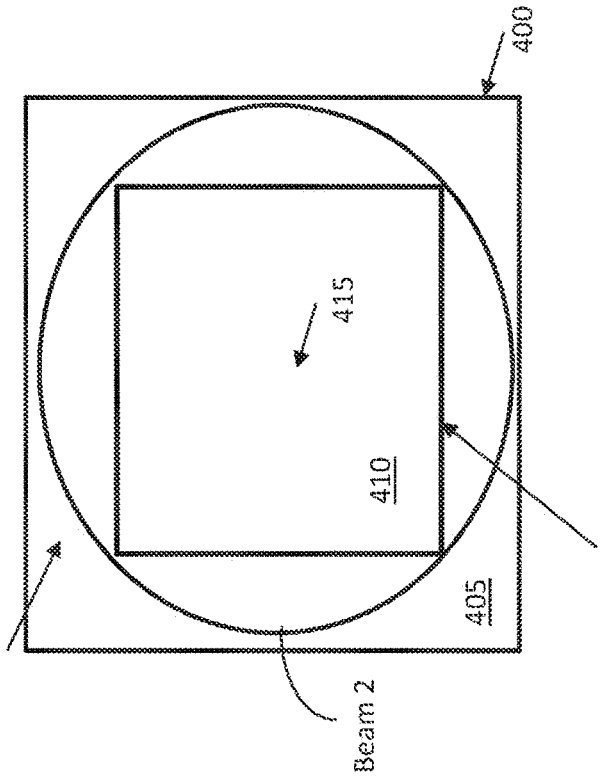
FIG. 4B illustrates an example of measurements of the measurement wafer sample using a Beam 2 with a larger spot diameter.
Figure 4A:
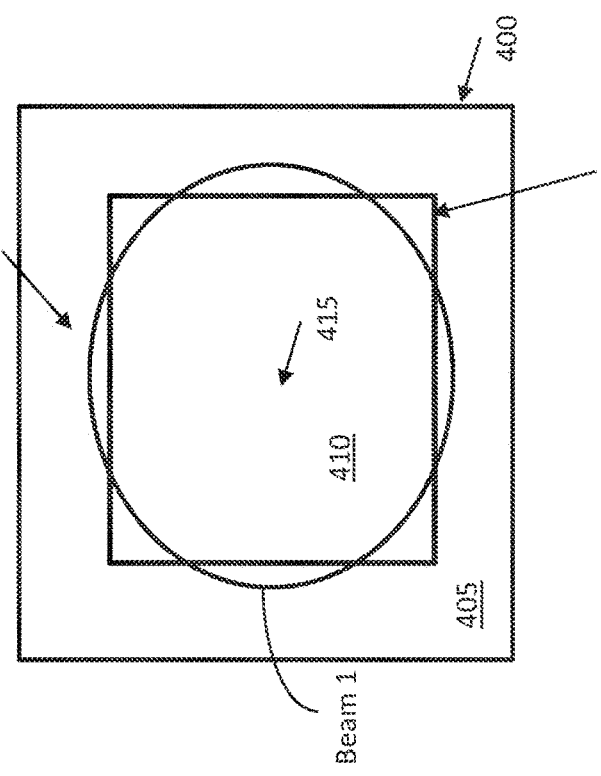
FIG. 4A illustrates an example of measurements of a measurement wafer sample using a nominal Beam 1.

Once the mixing fractions for Beam 1 and Beam 2 are known, the characterization process can perform additional measurements for a measurement sample 400 with unknown material and unknown thickness using the same respective Beam 1 and Beam 2, as shown in FIGS. 4A-B, so long as the size of the box remains the same as the reference sample.

FIG. 4A illustrates a measurement of a measurement sample 400 using the nominal Beam 1 and FIG. 4B illustrates a measurement characterizing the reference sample 400 using the Beam 2 according to one embodiment. Measurement sample 400 can represent sample 100 of FIG. 1. Measurement sample 400 can be provided by a customer where box 410 has a known 30 μm by 30 μm box dimension, similar to that of reference sample 300 of FIGS. 3A-B.

As previously described, Beam 1 has a spot of 40 μm in diameter providing a first mixing fraction $f_1$ and the Beam 2 has a spot of 50 μm in diameter providing a second mixing fraction $f_2$. Further, since measurement sample 400 has a same 30 μm box dimension as reference sample 300, the mixing fractions $f_1$ and $f_2$ would be the same as previously calculated for reference sample 300 of FIGS. 3A-B. Here, measurement sample 400 has an unknown substrate of material B (not shown) and an unknown overlayer 405 of material A. Within box 410, a film layer 415 of material A is on a surface of the substrate of material B.

The measurement sample 400 can be characterized using multiple measurements, e.g., Beam 1 (40 μm spot) in measurement 1, where raw intensities data for measurement 1 are collected and stored. Next, the beam of X-rays can be adjusted to provide Beam 2 (50 μm larger spot) to characterize the measurement sample 400 in measurement 2, and raw intensities data are collected and stored for measurement 2.

Following the measurements, the merit function to characterize Beam 1 and Beam 2 can be as follows:

$$M(I_{A1}, I_{B1}, I_{A2}, I_{B2}, f_1, f_2, t, K_A) = M_1 + M_2,$$

$$M_1(I_{A1}, I_{B1}, f_1, t, K_A) = \left(\frac{I_{A1}}{I_{B1}} - \frac{I_{A1}^M(t, f_1, K_A)}{I_{B1}^M(t, f_1)}\right)^2, \text{ and}$$

$$M_2(I_{A2}, I_{B2}, f_2, t, K_A) = \left(\frac{I_{A2}}{I_{B2}} - \frac{I_{A2}^M(t, f_2, K_A)}{I_{B2}^M(t, f_2)}\right)^2,$$

where $I_{A_{1,2}}^M \sim f_{1,2}(1 - e^{-(t/\lambda_1)}) + (1 - f_{1,2})/K_A$, $I_{B_{1,2}}^M \sim f_{1,2}e^{-(t/\lambda_2)}$, and where $I_{A_{1,2}}^M$ denotes a modeled intensities for species signal A for Beam 1 or Beam 2, $I_{B_{1,2}}^M$ denotes a modeled intensities for species signal B for Beam 1 or Beam 2, M denotes a merit function, $I_{A1}$ denotes a measured species intensity for material A using Beam 1, $I_{B1}$ denotes a measured species intensity for material B using Beam 1, $I_{A2}$ denotes a measured species intensity for material A using Beam 2, $I_{B1}$ denotes a measured species intensity for material B using Beam 2, $f_1$ denotes the first mixing fraction, $f_2$ denotes the second mixing fraction, t denotes a thickness of film layer 415 of material A inside box 410, $K_A$ denotes a constant representing the effective contribution of A to the intensity of the species signal, and $\lambda_{1,2}$ is a material parameter (effective attenuation length (EAL)) for photoelectrons of a specific type from species A,B passing in material A. Note that λ can be deduced by a lookup table or from a NIST database based on the binding energies for the species signals.

In this case, there are two measured signal ratios and two unknowns (t and $K_A$) in the merit function M. The merit function M can be solved by numerical methods to obtain the unknowns (t and $K_A$). In one embodiment, regression can be used to find values of t and $K_A$ that minimize the merit function between the measured raw spectra ratios (e.g., $I_{A1}/I_{B1}$ and $I_{A2}/I_{B2}$) and the modeled or estimated photoemission intensity ratios (e.g., $I_{A1}^M/I_{B1}^M$ and $I_{A2}^M/I_{B2}^M$), simultaneously, as obtained by the expressions above.

For example, different t and $K_A$ values can be iteratively used in the expressions to generate different values for modeled ratio intensities $I_{A1}^M/I_{B1}^M$, and the resulting values are then plugged into the merit function $M_1$ until the value of the $M_1$ is minimized to determine t and $K_A$. Simultaneously, the t and $K_A$ can be iteratively used in the expressions to generate different values for modeled intensities $I_{A2}^M$ and $I_{B2}^M$, and the resulting values are then plugged into the merit function $M_2$ until the value of the $M_1$ and $M_2$ are minimized to simultaneously determine t and $K_A$. Here, the portion of signal $(1-f_{1,2})/K_A$ produced by the overlayer material A contributes to the species signal from outside the box to inside the box.

Figure 5:
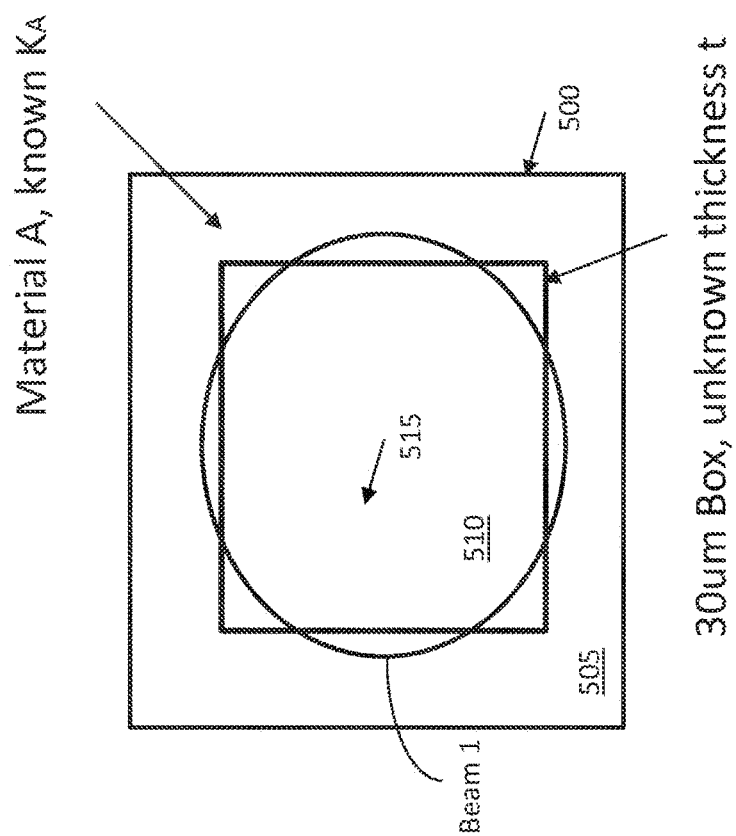
FIG. 5 illustrates an example of a measurement of a measurement wafer sample using a nominal Beam 1.

FIG. 5 illustrates measurement of a sample 500 with a known overlayer material ($K_A$) 505 and an unknown thickness (t) of film layer 515 of the known material $K_A$ using the nominal Beam 1 (40 μm spot) according to one embodiment. Measurement sample 500 can represent sample 400 of FIGS. 4A-B having box 510 with a side length of 30 μm. In one embodiment, sample 500 can be fabricated with a same overlayer material as sample 400 in FIGS. 4A-B in a batch processing. Since the mixing fractions and the overlayer material 505 are known from prior measurements, a thickness measurement of the film layer can be calculated.

For example, a merit function for the measurement sample 500 using Beam 1 can be as follows:

$$M_1(I_{A1}, I_{B1}, f_1, t, K_A) = \left(\frac{I_{A1}}{I_{B1}} - \frac{I_{A1}^M(t, f_1, K_A)}{I_{B1}^M(t, f_1)}\right)^2.$$

The measured ratios of species signal $I_{A1}/I_{B1}$ can be obtained from an XPS measurement for measurement sample 500. Since $K_A$ and $f_1$ are known from prior measurements (from the measurements of FIGS. 4A-4B), t can be calculated from the merit function $M_1$.

Figure 6:
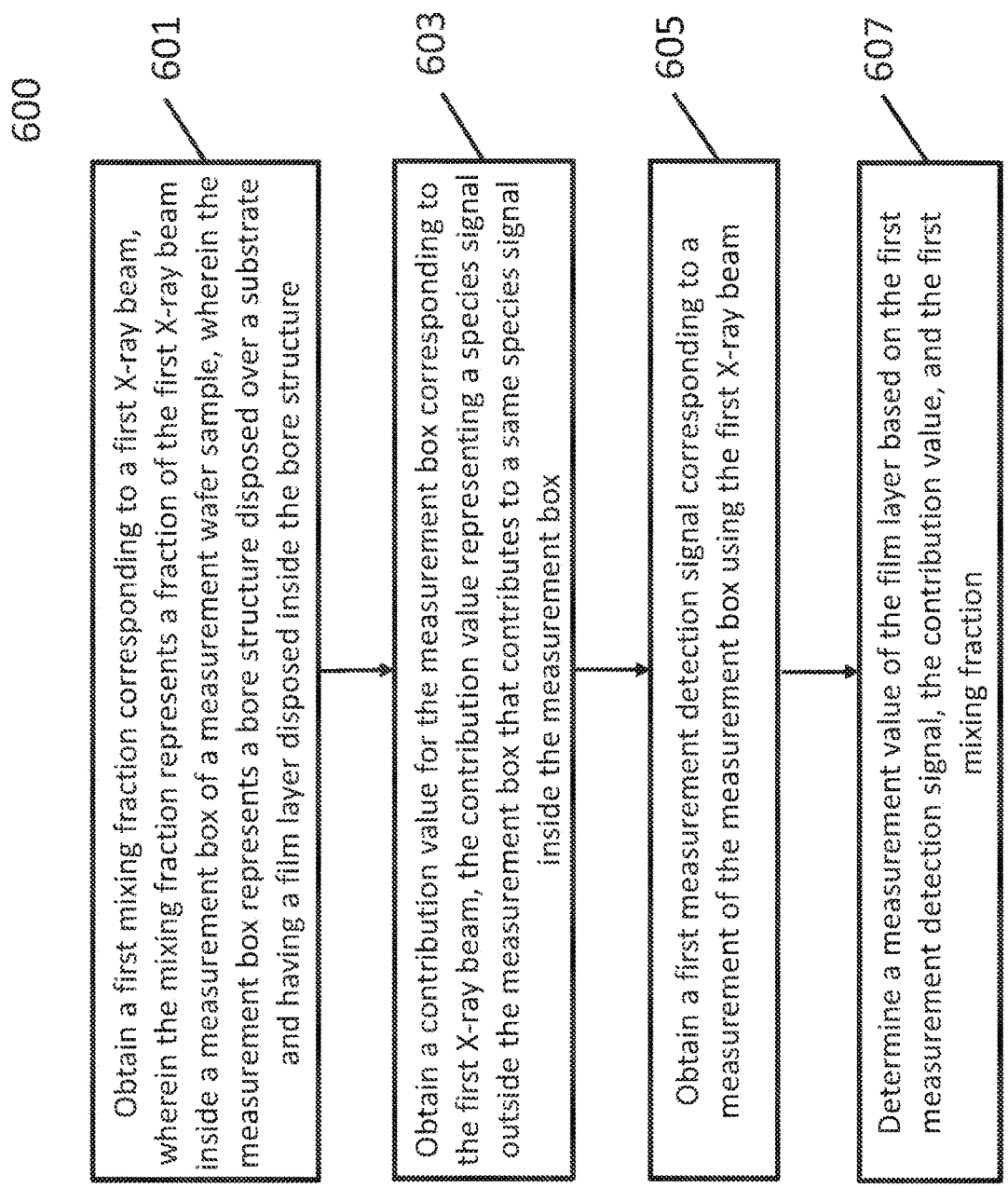
FIG. 6 is a flow diagram illustrating an example of a method.

FIG. 6 is a flow diagram illustrating a method to characterize a box 110 according to one embodiment. Process 600 may be performed by processing logic which may include software, hardware, or a combination thereof. For example, process 600 may be performed by computer 205 of FIG. 2.

Referring to FIG. 6, at block 601, processing logic obtains a first mixing fraction $f_1$ corresponding to a first X-ray beam (Beam1), where the mixing fraction represents a fraction of the first X-ray beam inside a measurement box (box 510) of a measurement wafer sample (sample 500) and the measurement box represents a bore structure disposed over a substrate and having a film layer disposed inside the bore structure.

For example, as described in FIG. 3A, a reference sample 300 with known thickness and known material $K_{SiO}$ can be used to obtain the first mixing fraction $f_1$ corresponding to the first X-ray beam (Beam 1). The mixing fraction can be calculated using the merit function $M_1$ as previously described. The mixing fraction $f_1$ can represent the portion of a beam of X-rays inside the box where the beam of X-rays is directed at the box, and the spillage $(1-f_1)$ indicates the portion of the beam of X-rays outside the box.

The measurement box (box 510) can be represented by sample 500 of FIG. 5. Here, sample 500 can be provided by a customer and sample 500 has at least one bore with known dimensions of 30 μm by 30 μm, same as reference sample 300, where the overlay material A can be known and the film layer thickness at the bottom of the bore is unknown.

In one embodiment, obtaining the first mixing fraction $f_1$ corresponding to the first X-ray beam (Beam 1) comprises: obtaining a first reference detection signal (XPS signal for a measurement of reference sample 300 using Beam 1) for a reference sample (sample wafer with reference sample 300); obtaining a first reference measured ratios $(I_{SiO1}/I_{Si1})$ from species signals (determined by looking up the binding energies of SiO2 and Si and determining the XPS signal peak values) of the first reference detection signal (XPS signal); and determining the first mixing fraction $f_1$ based on the first reference measured ratio $(I_{SiO1}/I_{Si1})$.

In one embodiment, obtaining the first reference detection signal (XPS signal) comprises: providing the reference sample (reference sample 300) with a reference box 310 to be irradiated, wherein the reference box has a film layer (SiO2) with a known thickness (e.g., 2 nm) and a known contribution factor ($K_{SiO}$); generating the first X-ray beam (Beam 1) with a first condition (spot size of 40 μm in diameter); directing the first X-ray beam (Beam 1) towards the reference sample (reference sample 300); collecting measurements to obtain the first reference detection signal (XPS signal). Here, the contribution factor $K_{SiO}$ represents the effective contribution of SiO2 electrons to the intensity of the species in the XPS signal.

In one embodiment, determining the first mixing fraction $f_1$ based on the first reference measured ratio $(I_{SiO1}/I_{Si1})$ comprises: determining a first residual error function $(M_1)$ having the first mixing fraction $f_1$ corresponding to the first X-ray beam (Beam 1); calculating a first reference measured ratio $(I_{SiO1}/I_{Si1})$ and a first ratio of modeled intensities $(I_{SiO1}{}^M/I_{Si1}{}^M)$; and calculating the first mixing fraction $f_1$ based on the first reference measured ratio and first ratio of modeled intensities.

At block 603, processing logic obtains a contribution value $(1-f_1)/K_A$ for the measurement box (box 510) corresponding to the first X-ray beam, the contribution value representing a species signal outside the measurement box that contributes to a same species signal inside the measurement box.

For example, as described in FIGS. 4A-B, the species signal contribution value $(1-f_1)/K_A$ can be calculated using the $K_A$ and $f_1$ values. As described above, measurement sample 400 can be provided by a customer to calculate $K_A$, where sample 400 has at least a bore structure (box 410) with a known dimension of 30 μm by 30 μm, same as reference sample 300. Further, the overlayer material 405 of sample 400 is unknown and a film layer 415 inside the bore structure 410 has an unknown thickness of the unknown material.

Using Beam 1 with a spot of 40 μm in diameter, measurements can be performed to collect a measured species intensities ratio for the Beam 1. Using Beam 2 with a spot of 50 μm in diameter (e.g., larger spot), measurements can be performed to collect a measured species intensities ratio for the Beam 2. Using the measured species ratios intensities and the calculated mixing fractions $f_1$ and $f_2$, the thickness t and $K_A$ can be simultaneously calculated using regression. Using the $K_A$ and $f_1$ values, the species signal contribution value can be calculated as $(1-f_1)/K_A$.

In one embodiment, processing logic further calculates a second mixing fraction $f_2$, including: obtaining a second reference detection signal (XPS measurement with Beam 2 for reference sample 300) for a reference sample; obtaining a second reference measured ratio $(I_{SiO2}/I_{Si2})$ from species signals of the second reference detection signal; and determining the second mixing fraction $f_2$ based on the second reference measured ratio $(I_{SiO2}/I_{Si2})$.

In one embodiment, obtaining the second reference detection signal (XPS signal) comprises: providing a reference sample (reference sample with sample 300) with a reference box 310 to be irradiated, wherein the reference box 310 has a film layer with a known thickness (2 nm) and a known contribution factor ($K_{SiO}$); generating a second X-ray beam (Beam 2) with a second condition (spot diameter=50 μm); directing the second X-ray beam (Beam 2) towards the reference sample; and collecting measurements to obtain the second reference detection signal (XPS signal).

In one embodiment, determining the second mixing fraction $f_2$ based on the second reference measured ratio $(I_{SiO2}/I_{Si2})$ further comprises: determining a second residual error function $(M_2)$ having the second mixing fraction $f_2$ and corresponding to the second X-ray beam (Beam 2); calculating the second reference measured ratio $(I_{SiO2}/I_{Si2})$ and a second ratio of modeled intensities $(I_{SiO2}{}^M/I_{Si2}{}^M)$; and calculating the second mixing fraction $f_2$ based on the second reference measured ratio $(I_{SiO2}/I_{Si2})$ and second ratio of modeled intensities $(I_{SiO2}{}^M/I_{Si2}{}^M)$.

In one embodiment, obtaining the contribution value for the measurement box corresponding to the first X-ray beam comprises: obtaining a second (XPS signal for sample 400 using Beam 1) and third measurement detection signals (XPS signal for sample 400 using Beam 2) for a measurement sample (sample 400); obtaining a first $(I_{A1}/I_{B1})$ and second measured ratios $(I_{A2}/I_{B2})$ from species signals of the second and third measurement detection signals; and determining the contribution value $(1-f_1)/K_A$ based on the first and second measured ratios.

As shown in FIGS. 4A-B, the species signal contribution value $(1-f_1)/K_A$ can be calculated using the $K_A$ and $f_1$ values, where the thickness t and $K_A$ can be simultaneously calculated by a measurement with Beam 1 and a measurement with Beam 2 for sample 400 to obtain the $K_A$.

In one embodiment, obtaining the second and third measurement detection signals comprises: providing a first measurement sample (wafer sample 400 of FIGS. 4A-B) with measurement box to be irradiated, wherein inside the measurement box has a film layer of an unknown thickness and an unknown contribution factor ($K_A$); generating the first X-ray beam (Beam 1) with a first condition (40 μm spot); directing the first X-ray beam (Beam 1) towards the measurement sample; collecting measurements to obtain the second measurement detection signal (XPS signal); generating a second X-ray beam (Beam 2) with a second condition (50 µm spot); directing the second X-ray beam (Beam 2) towards the measurement sample; and collecting measurements to obtain the third measurement detection signal (XPS signal).

In one embodiment, determining the contribution value $(1-f_1)/K_A$ based on the first $(I_{A1}/I_{B1})$ and second measured ratios $(I_{A2}/I_{B2})$ comprises: determining the first residual error function $(M_1)$ having the first mixing fraction $f_1$ corresponding to the first X-ray beam (Beam 1); determining the second residual error function $(M_2)$ having a second mixing fraction $f_2$ that corresponds to a second two X-ray beam (Beam 2); and performing a regression to minimize a difference between the first $(I_{A1}/I_{B1})$ and second measured ratios $(I_{A2}/I_{B2})$ and ratios of modeled intensities corresponding to the first $(I_{A1}{}^M/I_{B1}{}^M)$ and second $(I_{A2}{}^M/I_{B2}{}^M)$ residual error functions $(M_1, M_2)$ to simultaneously determine the contribution value $(K_A$ or $(1-f_1)/K_A)$ and the thickness value t of the film layer.

At block 605, processing logic obtains a first measurement detection signal (XPS signal) corresponding to a measurement of the measurement box (box 510) using the first X-ray beam (Beam 1).

For example, as described in FIG. 5, the customer can provide a wafer sample with sample 500 to be measured, where sample 500 has a known overlayer material A with an unknown film layer thickness. A XPS measurement can be performed for sample 500 to obtain XPS signals/raw intensities (e.g., first measurement detection signal) for the measurement sample 500.

At block 607, processing logic determines a measurement value of the film layer based on the first measurement detection signal (XPS signal measuring sample 500 of FIG. 5 using Beam 1), the contribution value $(1-f_1)/K_A$, and the first mixing fraction $f_1$.

For example, from the XPS signals/raw intensities collected for sample 500 of FIG. 5, with a known overlayer material A, processing logic can obtain a measured ratio of intensities (e.g., $I_A/I_B$) from the XPS signals. Using the measured ratio of intensities $(I_A/I_B)$, $K_A$, and $f_1$, processing logic can calculate the thickness t value using ratios of modeled intensities $(I_A{}^M/I_B{}^M)$ from the merit function $M_1$.

In one embodiment, determining the measurement value (e.g., thickness t) of the film layer based on the contribution value $(1-f_1)/K_A$ and the first mixing fraction $f_1$ comprises: determining a third measured ratio $(I_A/I_B)$ based on species signal of the first measurement detection signal (XPS signal measuring sample 500 using Beam 1); determining a first residual error function $M_1$ having the first mixing fraction $f_1$ corresponding to the first X-ray beam (Beam 1); and calculating the measurement value (thickness t) of the film layer by minimizing a difference between third measured ratios $(I_A/I_B)$ and ratios of modeled intensities $(I_A{}^M/I_B{}^M)$ for the first residual error function $M_1$.

Thus, FIGS. 3-6 describe an XPS characterization technique to characterize a material composition of a film layer and a thickness of the film layer within a small 30 µm box (bore). Although a 40 um and a 50 um beam are shown, the beams of X-rays can be of any spot size for calculations of respective mixing fractions. Furthermore, the characterization technique can be extended to more than one film layer within the box, as further described in FIG. 7.

Figure 7:
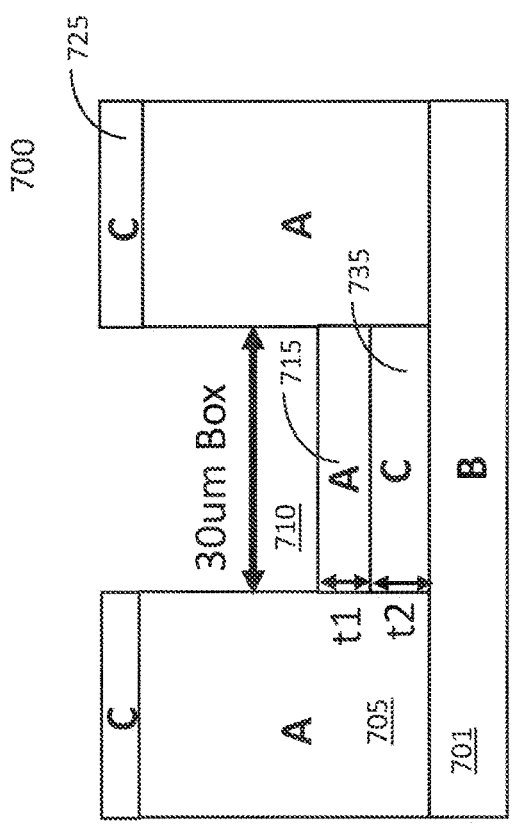
FIG. 7 is a partial cross-section of an example of a wafer sample with a box illustrating two film layers.

FIG. 7 is a partial cross-section of a section of a wafer sample 700 illustrating two film layers (715, 735) according to one embodiment. Sample 700 can represent sample 100 of FIG. 1 having box 710 with a side length of 30 µm and with two film layers within box 710. As shown in FIG. 7, box 710 is formed in an overlay 705 of material A deposited on a substrate 701 of material B. A thin film layer 725 of material C is deposited on overlay 705. Within box 700, there is a film layer 715 of material A (thickness=$t_1$) on a film layer 735 of material C (thickness=$t_2$), which are on substrate 700 of material B.

To characterize box 700, the merit function can be as follows:

$$M = \sum_{i=1}^{2} M_i(I_{Ai}, I_{Bi}, I_{Ci}, f_i, t_1, t_2, K_A, K_C) =$$

$$\left(\frac{I_{Ai}}{I_{Bi}} - \frac{I_{Ai}^M(t, f_i, K_A)}{I_{Bi}^M(t, f_i)}\right)^2 + \left(\frac{I_{Ci}}{I_{Bi}} - \frac{I_{Ci}^M(t, f_i, K_C)}{I_{Bi}^M(t, f_i)}\right)^2, \text{ where}$$

$$I_{Ai}^M \approx f_i(1 - e^{-(t_1/\lambda_3)}) + (1 - f_i)/K_A,$$

$$I_{Ci}^M \approx f_i(1 - e^{-(t_2/\lambda_4)})e^{-(t_1/\lambda_5)} + (1 - f_i)/K_C, \text{ and}$$

$$I_{Bi}^M \approx f_i e^{-(t_1/\lambda_1)}e^{-(t_2/\lambda_2)},$$

where M denotes a merit function, $M_i$ denotes the merit function for ith beam, $I_{A_i}{}^M$ denotes a modeled intensities for species signal A for ith Beam, $I_{B_i}{}^M$ denotes a modeled intensities for species signal B for ith Beam, $I_{C_i}{}^M$ denotes a modeled intensities for species signal C for ith Beam, $I_{Ai}$ denotes a measured species intensity for material A for ith Beam, $I_{Bi}$ denotes a measured species intensity for material B for ith Beam, $I_{Ci}$ denotes a measured species intensity for material C for ith Beam, $f_i$ denotes the ith mixing fraction, $t_1$ denotes a thickness of film layer of material A inside box 110, $K_A$ denotes a constant representing the effective contribution of A to the intensity of the species signal, $t_2$ denotes a thickness of film layer of material C inside box 110, $K_C$ denotes a constant representing the effective contribution of C to the intensity of the species signal, and $\lambda_{1,2,3,4,5}$ is a material parameter (effective attenuation length (EAL)) for photoelectrons of a specific type from species A, B, or C passing in material A or C. Note that $\lambda$ can be deduced by a lookup table or from a NIST database based on the binding energies for the species signals.

There are four unknown values: $t_1$, $t_2$, $K_A$ and $K_C$ in the above merit function. To solve for the four unknowns, 2 beams of different size are used to provide for 4 separate measurement ratios $I_{B1}/I_{A1}$, $I_{C1}/I_{A1}$, $I_{B2}/I_{A2}$, and $I_{C2}/I_{A2}$. With the 4 measurement ratios and 4 unknowns, a regression method can be applied to the merit function to solve for the unknowns.

As previously described, different beam conditions provide different mixing fractions, e.g., condition 1 provides a beam with a 40 µm spot dimeter and condition 2 provides a beam with a 50 µm spot diameter, to solve a merit function. In some embodiments, different beam positions (x or y offsets) provides different mixing fractions to solve a merit function, as further described in FIGS. 8A-10.

Figure 8B:
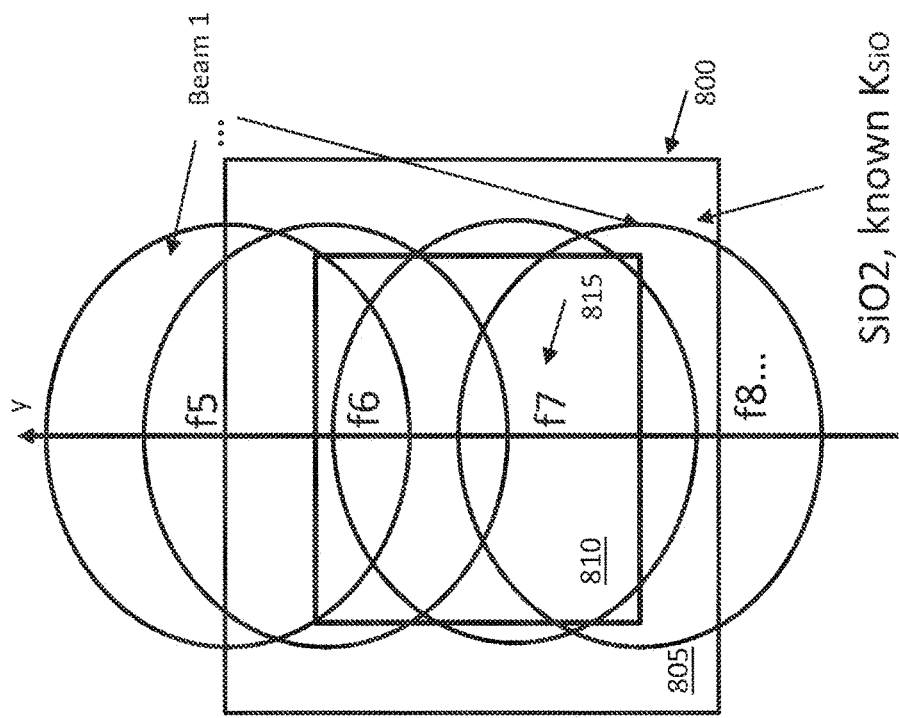
FIG. 8B illustrates an example of a measurement of the reference wafer sample using Y line scans.
Figure 8A:
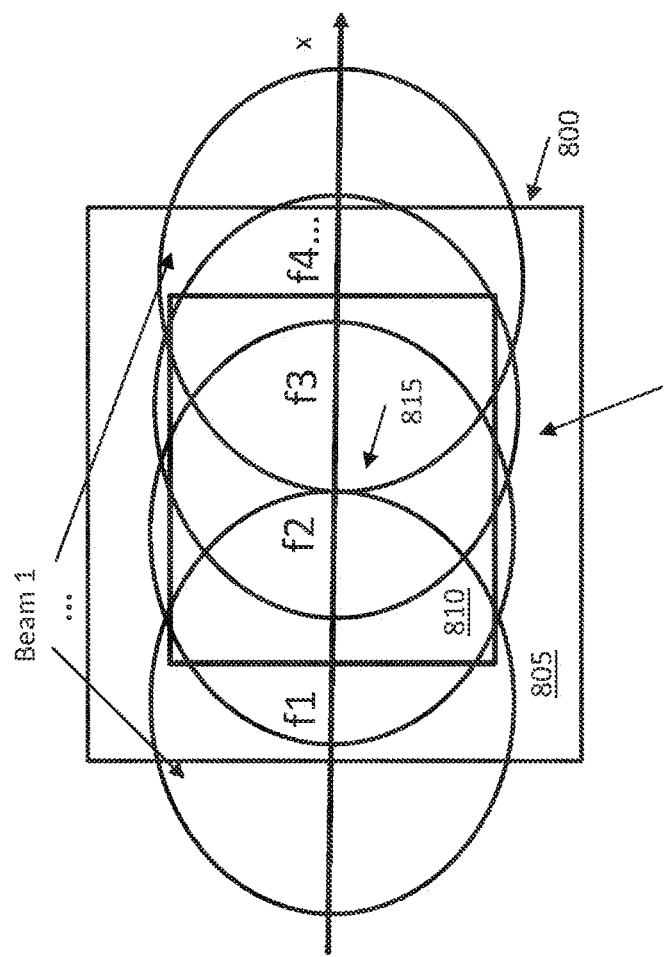
FIG. 8A illustrates an example of a measurement of a reference wafer sample using X line scans.

FIG. 8A illustrates a measurement of a reference sample 800 using X line scans and FIG. 8B illustrate a measurement of the reference sample 800 using Y line scans according to one embodiment. Reference sample 800 can represent sample 300 of FIGS. 3A-B, e.g., 30 µm box with a known film layer material SiO2 and an unknown film layer thickness within box 810. As shown in FIGS. 8A-B, multiple measurements with a Beam 1 having a 40 µm spot diameter can be performed on measurement sample 800 with x and/or y offsets. The x and y offsets refers to x or y directional movements of the stage containing the sample 800. For X scans, an example can be: at time 1, a scan can be performed at $(x_1, y_1)=(0, 0)$; at time 2, a scan can be performed at $(x_2, y_2)=(10\ \mu m, 0)$; at time 3, a scan can be performed at $(x_2, y_2)=(20\ \mu m, 0)$, and so forth, using a same stage setup.

Figure 9:
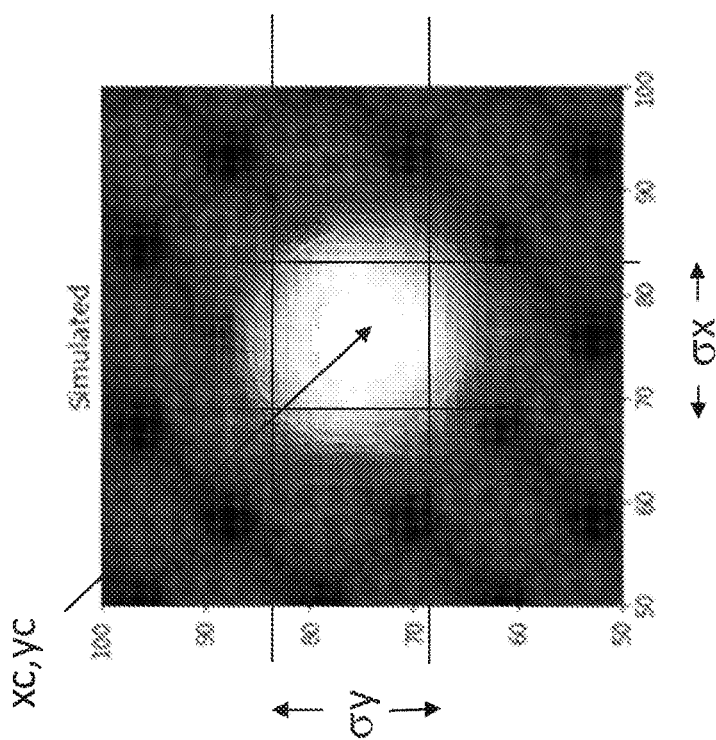
FIG. 9 illustrates an example of a simulation of beam parameters of a beam of X-rays.

In one embodiment, the mixing fraction can be represented as a Gaussian equation, for the beam of X-rays directed at the wafer sample can be assumed Gaussian-like. The property of Beam 1 is shown in FIGS. 9-10C. For example, the beam can be represented by a center coordinate $(x_c, y_c)$ that is relative to a center of box 810. $(\sigma_x, \sigma_y)$ are the one standard deviation of Gaussian-like Beam 1 in the x and y directions. Refer to FIGS. 10A-C, the measured mixing fraction and the modeled Gaussian-like mixing fractions for y, x center cross sections are shown in the plots 1000-1003. The modeled mixing fraction versus beam location is shown in plot 1005, illustrating a Gaussian equation is a good fit to model the mixing fraction, as further described below. Because the center of the beam may not always coincide with the center of the box (due to small displacement errors of the stage setup), thus, the X/Y scans have a slight offset. Since these offsets are unknown, $(x_c, y_c)$ can be used to optimize the alignment the modeled data and the measurement data. Further $(\sigma_x, \sigma_y)$ can be optimized as the one standard deviation of an assumed Gaussian-like x-ray beam directed at the sample.

Referring to FIGS. 8A-10, the mixing fractions can be represented by a Gaussian equation using the stage positions e.g., $(x_i, y_i)$, and measurement offsets of the beam, e.g., $(x_c, y_c, \sigma_x, \sigma_y)$. The mixing fractions for each of the scans can be as follows:

$$f_i = f(x_i, y_i, x_c, y_c, \sigma_x, \sigma_y) = \frac{1}{2\pi\sigma_x\sigma_y}e^{-\frac{1}{2}\left[\left(\frac{x_i-x_c}{\sigma_x}\right)^2+\left(\frac{y_i-y_c}{\sigma_y}\right)^2\right]},$$

where $f_i$ denotes ith mixing fraction for the ith beam scan, $(x_i, y_i)$ denotes the x and y position of the stage relative to a center of the box 810, $(x_c, y_c)$ are the optimized center coordinates of the beam relative to the center of the box 810, $(\sigma_x, \sigma_y)$ are the lengths at the x, y direction of one standard deviation of the Gaussian-like x-ray beam.

Next, each X/Y measurement scan can be described with a merit function. The merit function for sample 800 can be as follows:

$$M = \sum_{i=1}^{n}M_i(x_i, y_i, I_{Si_i}, I_{SiO_i}, K_{SiO}, x_c, y_c, t, \sigma_x, \sigma_y) = \sum_{i=1}^{n}\left[\left(\frac{I_{SiO_i}}{I_{Si_i}}\right)-\left(\frac{I_{SiO_i}^M}{I_{Si_i}^M}\right)\right]^2,$$

$$I_{SiO_i}^M \sim f_i(x_i, y_i, x_c, y_c, t, \sigma_x, \sigma_y)\left(1-e^{-\frac{t}{\lambda_{SiO}}}\right)+$$

$$(1-f_i(x_i, y_i, x_c, y_c, t, \sigma_x, \sigma_y))/K_{SiO},\ \text{and}$$

$$I_{Si_i}^M \sim f_i(x_i, y_i, x_c, y_c, t, \sigma_x, \sigma_y)e^{-\frac{t}{\lambda_{Si,SiO}}}$$

where M denotes a merit function, $M_i$ denotes the merit function for ith scan, $f_i$ denotes the mixing fraction of ith scan ($f_i$ can be represented as stage position $(x_i, y_i)$ and beam measurement offsets $(x_c, y_c, \sigma_x, \sigma_y)$), $(x_i, y_i)$ denotes the x and y position of the stage relative to a center of the box 810 for ith scan, n denotes the total number of scans, $I_{Si_i}$ denotes a measured intensity for species Si for ith scan, $I_{SiO_i}$ denotes a measured intensity for species SiO2 for ith scan, $K_{SiO}$ denotes a constant representing the effective contribution of SiO2 to the intensity of the species signal, $(x_c, y_c)$ are the optimized center coordinates of the beam relative to the center of the box 810, t denotes a thickness of film layer 815 of material SiO2 inside box 810, and $(\sigma_x, \sigma_y)$ are the x or y direction one standard deviation values.

Performing multiple X/Y scans provides the $x_i, y_i, I_{Si_i}, I_{SiO_i}$ values, where ith is a respective scan. The $K_{SiO}$ value is known because the sample 800 has known SiO2 layer 805 and SiO2 film inside box 810. The unknown variables in this case are: $x_c, y_c, t, \sigma_x, \sigma_y$. Thus, 5 measurement scans can provide 5 ratios of species intensities to solve for the five unknown variables $x_c, y_c, t, \sigma_x, \sigma_y$, and the unknown can be solved by applying a regression technique to the merit function M. Having characterized the offset for the beam, e.g., determined $(x_c, y_c, \sigma_x, \sigma_y)$, a new measurement sample 1100 of unknown film thickness of unknown material A can be characterized, as shown in FIGS. 11A-B.

FIG. 11A illustrates a measurement of a measurement sample 1100 using X line scans and FIG. 11B illustrates a measurement of the measurement sample 1100 using Y line scans according to one embodiment. Sample 1100 can represent reference sample 800 of FIGS. 8A-B with box 1110 having side lengths of 30 μm and overlayer 1105 of material A. The measurement scans can be described by a merit function. The merit function can be as follows:

$$M = \sum_{i=1}^{n}M_i(x_i, y_i, I_{Ai}, I_{Bi}, \sigma_x, \sigma_y, x_c, y_c, t, K_{A,B}) = \sum_{i=1}^{n}=\left[\left(\frac{I_{A_i}}{I_{B_i}}\right)-\left(\frac{I_{A_i}^M}{I_{B_i}^M}\right)\right]^2$$

where M denotes a merit function, $M_i$ denotes the merit function for ith scan, $$\frac{I_{A_i}}{I_{B_i}}$$

denotes the measured species intensities ratio for ith scan, $$\frac{I_{A_i}^M}{I_{B_i}^M}$$

denotes the modeled species intensities ratio for ith scan, $(x_i, y_i)$ denotes the x and y positions of the stage relative to a center of the box 1110 for ith scan, $I_{Ai}$ denotes a measured intensity for species A for ith scan, $I_{Bi}$ denotes a measured intensity for species B for ith scan, $(\sigma_x, \sigma_y)$ are the 1 standard deviation values in the x or y directions, $(x_c, y_c)$ are the optimized center coordinates of the beam relative to the center of the box 1110, t denotes a thickness of film layer 1115 of material A inside box 1110, $K_{A,B}$ denotes a constant representing the effective contribution of A,B to the intensity of the species signal.

The unknown variables in this case are: $x_c, y_c, t, K_{A,B}$. Thus, 4 measurements scans can provide 4 ratios of species intensities to solve for the four unknown variables $x_c, y_c, t, K_{A,B}$ using a regression technique. Although only one film layer of unknown material having an unknown thickness is characterized in FIG. 11, the X/Y line scan characterization technique can be applied to a box sample with more than one film layers having one or more unknown materials, where additional scans can be provided to characterize any additional unknown parameters. In the alternative, other parameters can be characterized, such as $K_B$, by providing the additional measurement data from the additional measurement scans.

Figure 12:
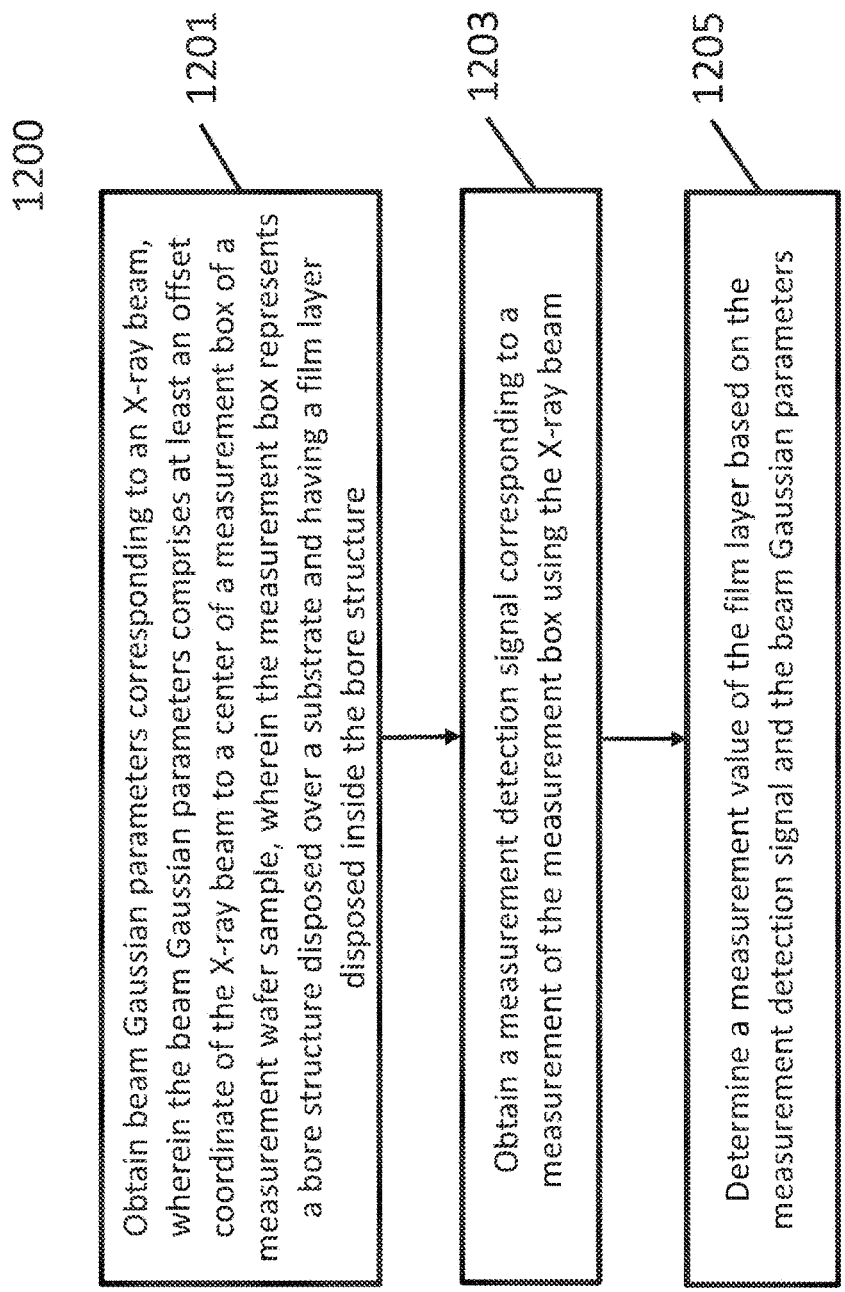
FIG. 12 is a flow diagram illustrating an example of a method.

FIG. 12 is a flow diagram illustrating a method according to one embodiment. Process 1200 may be performed by processing logic which may include software, hardware, or a combination thereof. For example, process 1200 may be performed by computer 205 of FIG. 2.

Referring to FIG. 12, at block 1201, processing logic obtains beam Gaussian parameters ($x_c$, $y_c$, $\sigma_x$, $\sigma_y$), wherein the beam Gaussian parameters comprises at least an offset coordinate ($x_c$, $y_c$) of the X-ray beam to center of a box (e.g., box 1110) of a sample (e.g., sample 1100), wherein the measurement box (e.g., box 1110) represents a bore structure with a film layer 1115 disposed inside the bore structure, the bore structure is formed on a layer 1105 fabricated over a substrate inside the bore structure.

For example, as illustrated in FIGS. 8A-B, a wafer sample 800 is provided for characterization using X/Y line scans to obtain the beam Gaussian parameters ($x_c$, $y_c$, $\sigma_x$, $\sigma_y$). The merit function for sample 800 is used to solve for the unknowns, e.g., ($x_c$, $y_c$, $\sigma_x$, $\sigma_y$) beam Gaussian parameters, using species intensities ratios obtained from the X/Y line scans. In one embodiment, the beam Gaussian parameters include the offset coordinate ($x_c$, $y_c$) of the X-ray beam to center of a box.

In one embodiment, the beam Gaussian parameters includes the optimized standard deviation values, ($\sigma_x$, $\sigma_y$).

In one embodiment, the unknown includes a thickness t measurement value of the film layer 815. In this case, additional X/Y line scans can be performed to obtain additional measured intensities ratios so the number of known measured intensities ratios are equal to or greater than the unknown variables to be solved. Thereafter, the thickness t measurement value and the beam Gaussian parameters can be determined simultaneously using regression.

At block 1203, processing logic obtains a measurement detection signal (XPS signal) corresponding to a measurement of the measurement box (e.g., box 1110) using the X-ray beam (Beam 1).

At block 1205, processing logic determines a measurement value (thickness) of the film layer based on the measurement detection signal (XPS signal) and the scanning parameters ($x_c$, $y_c$).

In one embodiment, processing logic obtains additional scanning parameters for stage adjustments that adjust the stage coordinates for the measurement box; obtains additional measurement detection signals corresponding to measurements at each stage adjustments; and an additional measurement value ($K_B$) of the measurement box based on the measurement additional detection signal, the contribution value, and the scanning parameters.

In one embodiment, processing logic performs a stage adjustment in an X or Y direction; and performs a measurement scan after the stage adjustment to obtain additional measurement detection signals.

Accordingly, a method to characterize a film layer within a measurement box using electron spectroscopy is provided, comprising: obtaining a first mixing fraction corresponding to a first X-ray beam, wherein the mixing fraction represents a fraction of the first X-ray beam inside a measurement box of a measurement wafer sample, wherein the measurement box represents a bore structure disposed over a substrate and having a film layer disposed inside the bore structure; obtaining a contribution value for the measurement box corresponding to the first X-ray beam, the contribution value representing a species signal outside the measurement box that contributes to a same species signal inside the measurement box; obtaining a first measurement detection signal corresponding to a measurement of the measurement box using the first X-ray beam; and determining a measurement value of the film layer based on the first measurement detection signal, the contribution value, and the first mixing fraction.

Obtaining the first mixing fraction corresponding to the first X-ray beam comprises: obtaining a first reference detection signal for a reference wafer sample; obtaining a first reference measured ratios from species signals of the first reference detection signal; and determining the first mixing fraction based on the first reference measured ratio.

Obtaining the first reference detection signal comprises: providing the reference wafer sample with a reference box to be irradiated, wherein the reference box has a film layer with a known thickness and a known contribution factor; generating the first X-ray beam with a first condition; directing the first X-ray beam towards the reference wafer sample; and collecting measurements to obtain the first reference detection signal.

Determining the first mixing fraction based on the first reference measured ratio comprises: determining a first residual error function having the first mixing fraction corresponding to the first X-ray beam; calculating a first reference measured ratio and a first ratio of modeled intensities; and calculating the first mixing fraction based on the first reference measured ratio and first ratio of modeled intensities.

Also calculating a second mixing fraction, including: obtaining a second reference detection signal for a reference wafer sample; obtaining a second reference measured ratio from species signals of the second reference detection signal; and determining the second mixing fraction based on the second reference measured ratio.

Obtaining the second reference detection signal comprises: providing the reference wafer sample with a reference box to be irradiated, wherein the reference box has a film layer with a known thickness and a known contribution factor; generating a second X-ray beam with a second condition; directing the second X-ray beam towards the reference wafer sample; and collecting measurements to obtain the second reference detection signal.

Determining the second mixing fraction based on the second reference measured ratio further comprises: determining a second residual error function having the second mixing fraction corresponding to the second X-ray beam; calculating a second reference measured ratio and a second ratio of modeled intensities; and calculating the second mixing fraction based on the second reference measured ratio and second ratio of modeled intensities.

Obtaining the contribution value for the measurement box corresponding to the first X-ray beam comprises: obtaining a second and third measurement detection signals for the measurement wafer sample; obtaining a first and second measured ratios from species signals of the second and third measurement detection signals; and determining the contribution value based on the first and second measured ratios.

Obtaining the second and third measurement detection signals comprises: providing the measurement wafer sample with the measurement box to be irradiated, wherein the measurement box has a film layer of an unknown thickness and an unknown contribution factor; generating the first X-ray beam with a first condition; directing the first X-ray beam towards the measurement wafer sample; collecting measurements to obtain the second measurement detection signal; generating a second X-ray beam with a second condition; directing the second X-ray beam towards the measurement wafer sample; and collecting measurements to obtain the third measurement detection signal.

Determining the contribution value based on the first and second measured ratios comprises: determining the first residual error function having the first mixing fraction corresponding to the first X-ray beam; determining the second residual error function having a second mixing fraction corresponding to a second two X-ray beam; and performing a regression to minimize a difference between the first and second measured ratios and ratios of modeled intensities for the first and second residual error functions to simultaneously determine the contribution value and the thickness value of the film layer.

Determining the measurement value of the film layer based on the contribution value and the first mixing fraction comprises: determining a third measured ratio based on species signal of the first measurement detection signal; determining a first residual error function having the first mixing fraction corresponding to the first X-ray beam; and calculating the measurement value of the film layer by minimizing a difference between third measured ratios and ratios of modeled intensities for the first residual error function.

According to aspects, a system to characterize a film layer within a measurement box is provided, comprising: a stage supporting a measurement wafer sample; an X-ray source generating a first X-ray beam to radiate the measurement wafer sample over at least an area of the measurement wafer sample having a measurement box, wherein the measurement wafer sample includes a first layer of a first material disposed over a substrate made of a substrate material, the first layer having a bore structure formed therein to thereby forming walls of the measurement box and a first film layer of the first material is disposed inside the bore structure; an electron analyzer dividing electrons emitted from the measurement wafer sample according to different electron energies; an electron detector detecting the electrons after passing through the electron analyzer and outputting detection signal; and a processor receiving the detection signal and determining species signals in energy band corresponding to electrons emitted from the first and substrate materials based on the detection signal, wherein the processor further performs the operations of: obtaining a first mixing fraction corresponding to a first X-ray beam, wherein the mixing fraction represents a fraction of the first X-ray beam inside the measurement box of the measurement wafer sample; obtaining a contribution value for the measurement box corresponding to the first X-ray beam, the contribution value representing a species signal outside the measurement box that contributes to a same species signal inside the measurement box; obtaining a first measurement detection signal corresponding to a measurement of the measurement box using the first X-ray beam; and determining a measurement value of the film layer based on the first measurement detection signal, the contribution value, and the first mixing fraction.

Obtaining the first mixing fraction corresponding to the first X-ray beam comprises: obtaining a first reference detection signal for a reference wafer sample; obtaining a first reference measured ratios from species signals of the first reference detection signal; and determining the first mixing fraction based on the first reference measured ratio.

Obtaining the first reference detection signal comprises: providing the reference wafer sample with a reference box to be irradiated, wherein the reference box has a film layer with a known thickness and a known contribution factor; generating the first X-ray beam with a first condition; directing the first X-ray beam towards the reference wafer sample; and collecting measurements to obtain the first reference detection signal.

Determining the first mixing fraction based on the first reference measured ratio comprises: determining a first residual error function having the first mixing fraction corresponding to the first X-ray beam; calculating a first reference measured ratio and a first ratio of modeled intensities; and calculating the first mixing fraction based on the first reference measured ratio and first ratio of modeled intensities.

The operations further comprise calculating a second mixing fraction, including: obtaining a second reference detection signal for a reference wafer sample; obtaining a second reference measured ratio from species signals of the second reference detection signal; and determining the second mixing fraction based on the second reference measured ratio.

Obtaining the second reference detection signal comprises: providing the reference wafer sample with a reference box to be irradiated, wherein the reference box has a film layer with a known thickness and a known contribution factor; generating a second X-ray beam with a second condition; directing the second X-ray beam towards the reference wafer sample; and collecting measurements to obtain the second reference detection signal.

Also, a method to characterize a film layer within a measurement box using electron spectroscopy is provided, comprising: obtaining beam Gaussian parameters corresponding to an X-ray beam, wherein the beam Gaussian parameters comprises at least an offset coordinate of the X-ray beam to a center of a measurement box of a measurement wafer sample, wherein the measurement box represents a bore structure disposed over a substrate and having a film layer disposed inside the bore structure; obtaining a measurement detection signal corresponding to a measurement of the measurement box using the X-ray beam; and determining a measurement value of the film layer based on the measurement detection signal and the beam Gaussian parameters.

Additionally, obtaining additional scanning parameters for stage adjustments that adjust the stage coordinates for the measurement box; obtaining additional measurement detection signals corresponding to measurements at each stage adjustments; and determining an additional measurement value of the measurement box based on the measurement additional detection signal, the contribution value, and the scanning parameters.

And performing a stage adjustment in an X or Y direction; and performing a measurement scan after the stage adjustment to obtain additional measurement detection signals.

Aspects of the disclosure include a method to characterize a film layer within a measurement box (small box) using electron spectroscopy, comprising: obtaining a first mixing fraction corresponding to a first X-ray beam, wherein the mixing fraction represents a fraction of the first X-ray beam inside a measurement box of a sample, wherein the measurement box represents a bore structure and a film layer that may be disposed over a substrate; obtaining a contribution value for the measurement box corresponding to the first X-ray beam, the contribution value representing a species signal outside the measurement box that contributes to a same species signal inside the measurement box; obtaining a first measurement detection signal corresponding to a measurement of the measurement box using the first X-ray beam; and determining a measurement value of the film layer based on the first measurement detection signal, the contribution value, and the first mixing fraction. The film layer may be positioned between bore structure and the bore structure or may be disposed inside the bore structure. Any reference to a film layer within the bore structure should be apply mutatis mutandis to a film layer located below the bore structure.

In further aspects, a system to characterize a film layer within a measurement box using electron spectroscopy is provided. The system comprises: a stage supporting a wafer sample; an X-ray source generating an X-ray beam to radiate the wafer sample over at least an area of the wafer sample having a measurement box, wherein the wafer sample includes a first layer of a first material disposed over a substrate made of a substrate material, the first layer having a bore formed therein to thereby forming walls of the measurement box and a first film layer of the first material disposed inside the bore; an electron analyzer dividing electrons emitted from the wafer sample according to different electron energies; an electron detector detecting the electrons after passing through the electron analyzer and outputting detection signal; and a processor receiving the detection signal and determining species signals in energy band corresponding to electrons emitted from the first and substrate materials based on the detection signal, wherein the processor further performs the operations of: obtaining a first mixing fraction corresponding to a first X-ray beam, wherein the mixing fraction represents a fraction of the first X-ray beam inside the measurement box of the wafer sample; obtaining a contribution value for the measurement box corresponding to the first X-ray beam, the contribution value representing a species signal outside the measurement box that contributes to a same species signal inside the measurement box; obtaining a first measurement detection signal corresponding to a measurement of the measurement box using the first X-ray beam; and determining a measurement value of the film layer based on the first measurement detection signal, the contribution value, and the first mixing fraction.

In further aspects, a method is provided to characterize a film layer within a measurement box using electron spectroscopy, comprising: obtaining beam Gaussian parameters corresponding to an X-ray beam, wherein the beam Gaussian parameters comprises at least an offset coordinate of the X-ray beam to center of a measurement box of a sample, wherein the measurement box represents a bore structure with a film layer disposed therein; obtaining a measurement detection signal corresponding to a measurement of the measurement box using the X-ray beam; and determining a measurement value of the film layer based on the measurement detection signal and the beam Gaussian parameters.

There may be provided a system to characterize a first film layer of a sample the system may include electron optics, and a processor. A non-limiting example of the system is illustrated in FIG. 2—the processor may be computer 205 or may be included in computer 205, and electron optics may include, for example at least some of electron gun 210, anode 215, monochromator 220, flux detector 230, XPS energy analyzer 240 and XPS detector 245.

The electron optics is configured to illuminate, with a X-ray spot, a first sample region that includes the first film layer (for example—measurement box 110 of FIG. 1) and a first sample sub-region (illuminated but located to the sides of the measurement box). The first film layer is made of a first film layer material and is positioned above a substrate that is made of a substrate material.

The electron optics is also configured to detect electrons emitted from the first sample region to provide detection signals.

The processor may be configured to determine species signals based on the detection signals, the species signals may include (i) first film layer material species signals in an energy band corresponding to electrons emitted from the first film layer material, and (ii) substrate material species signals in an energy band corresponding to electrons emitted from the substrate material.

The processor may also be configured to determine a measurement value of the first film layer based on (i) the species signals, (ii) mixing information (for example—f) that is indicative of a fraction of the X-ray spot that impinges on the first film layer, and (ii) a first film layer material contribution value (for example $K_{SiO}$) that represents an effective contribution of the first film layer material to at least one of the species signals.

The detection signals may be X-ray photoelectron spectroscopy (XPS) detection signals.

The measurement value may be a thickness of the film layer. The material(s) of the film layer may be determined based on frequency band(s) of the species signals.

The processor is configured to determine the thickness of the film layer based on a value of a merit function (for example M), the value of the merit function is determined based on a difference between an actual attenuation of the film layer and a modeled attenuation of the film layer. The actual attenuation of the film layer may be represented by $$\frac{I_{SiO}}{I_{Si}},$$

whereas the modeled attenuation of the film layer may be represented by $$\frac{I_{SiO}^M}{I_{Si}^M}.$$

Various examples of the merit functions are provided above.

The processor may be configured to determine the thickness of the film layer based on a value of a merit function, the value of the merit function is determined based on (i) the first film layer material species signals (for example—$I_{SiO}$), (ii) the substrate material species signals (for example—$I_{Si}$), (iii) the modeled first film layer material species signals (for example—$I_{SiO}^M$), and (iv) the modeled substrate material species signals (for example—$I_{Si}^M$).

The modeled first film layer material species signals may be calculated based on the mixing information, a first film layer attenuation parameter (for example—$\lambda_{SiO}$) related to photoelectrons generated within the first film layer, the thickness of the film layer, and the first film layer material contribution value.

The substrate material species signals are calculated based on the mixing information, the thickness of the film layer, a first film layer attenuation parameter (for example—$\lambda_{si,SiO}$) related to photoelectrons generated within the substrate, and a substrate material contribution value (for example $K_{Si}$) that represents an effective contribution of the substrate material to at least one of the species signals.

The mixing information may be indicative of a beam intensity distribution in relation to the one or more film layers. Thus the mixing information may indicate the beam intensity distribution above the one or more film layers—for example the percentage of radiation that impinges on the measurement box in relation to the total radiation.

The mixing information may include one or more beam Gaussian parameters. Examples of beam Gaussian parameters are illustrated above.

Figure 16:
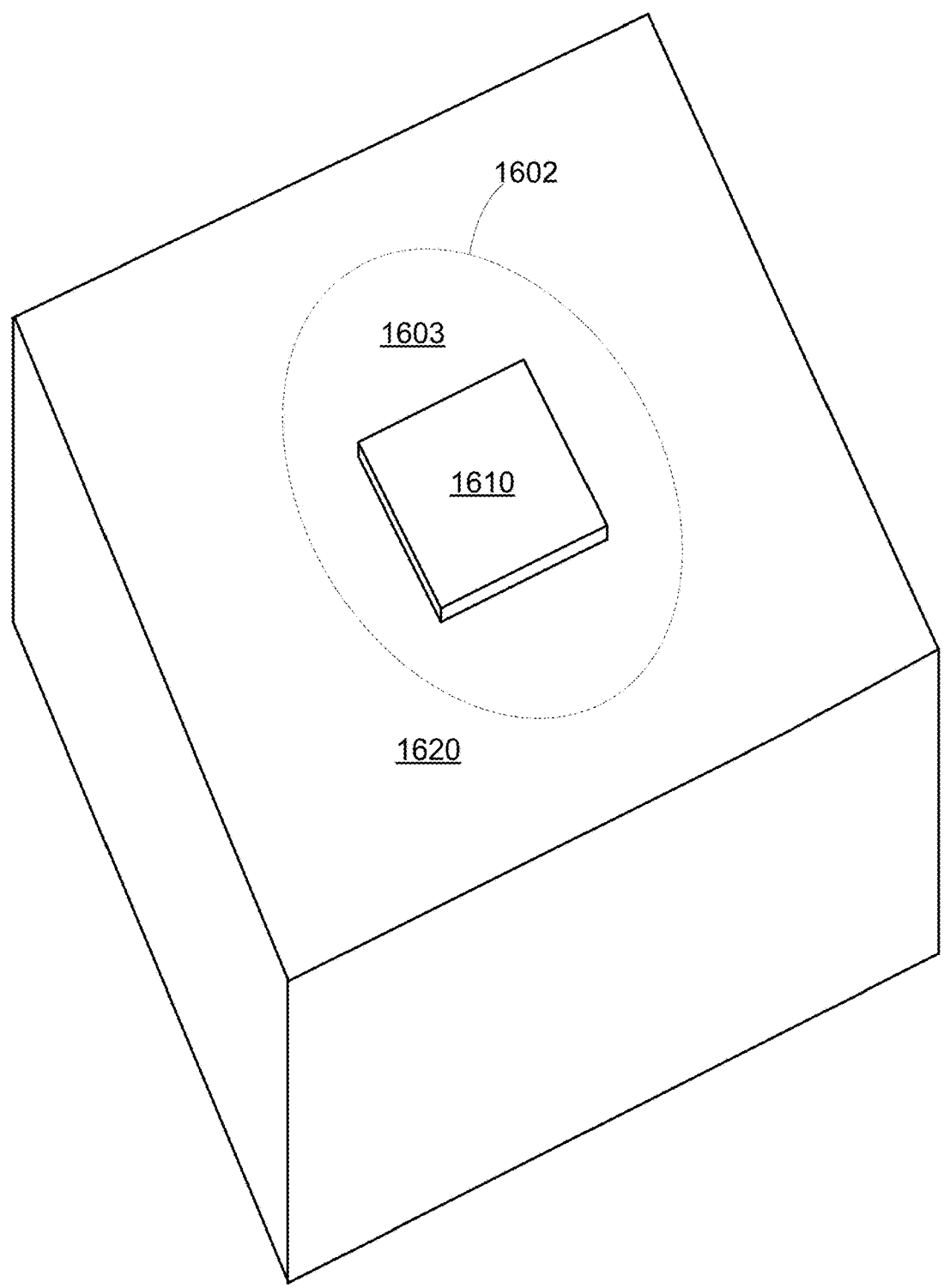
FIG. 16 is an example of a pad positioned above the substrate.

The film layer may be positioned above an upper surface of the additional sample sub-region—see, for example FIG. 16 of a pad 1610 of interest that is positioned above a substrate 1620. X-ray spot 1620 illuminates the pad 1610 of interest and a first sample sub-region that is also referred to as irrelevant region or contaminating region—that contributes a spillage signal to the signal sensed by the detector.

The film layer may be positioned below an upper surface of the additional sample sub-region. See—for example, FIGS. 1 and 7.

The sample region may include a second film layer that is made of a second film layer material and is located outside the first sample sub-region. See for example—FIG. 7 that illustrates two film layers 715 and 735, we will assume that the second film layer is denoted 715.

In this case, the processor is further configured to determine, based on the detection signals, second film layer material species signals in an energy band corresponding to electrons emitted from the second film layer material. The processor is also configured to determine a measurement value of the second film layer based on (i) the species signals, (ii) the mixing information, and (ii) a second film layer material contribution value that represent an effective contribution of the second film layer material to at least one of the species signals.

When there are two film layers that may be need to gather more information—as there are more unknown variables related to the two film layers. This may require performing one or more additional measurements that may involve having the electron optics illuminate, with the X-ray spot, a second sample region that may include the second film layer and a second sample sub-region; and detect electrons emitted from the second sample region to provide detection signals. Examples of additional measurements are illustrated in FIGS. 8A and 8B.

FIG. 13 is a flow diagram illustrating a method according to one embodiment. Method 1300 may be performed by processing logic which may include software, hardware, or a combination thereof. For example, method 1300 may be performed by computer 205 of FIG. 2.

Method 1300 may start by step 1310 of illuminating, by electron optics and with a X-ray spot, a first sample region that includes the first film layer and a first sample sub-region. The first film layer is made of a first film layer material and is positioned above a substrate that is made of a substrate material.

Step 1310 may be followed by step 1320 of detecting, by the electron optics, electrons emitted from the first sample region to provide detection signals.

Step 1320 may be followed by step 1330 of determining, by a processor, species signals based on the detection signals, the species signals may include (i) first film layer material species signals in an energy band corresponding to electrons emitted from the first film layer material, and (ii) substrate material species signals in an energy band corresponding to electrons emitted from the substrate material.

Step 1330 may be followed by step 1340 of determining, by the processor, a measurement value of the first film layer based on (i) the species signals, (ii) mixing information (for example—f) that is indicative of a fraction of the X-ray spot that impinges on the first film layer, and (ii) a first film layer material contribution value (for example $K_{SiO}$) that represents an effective contribution of the first film layer material to at least one of the species signals.

The detection signals may be X-ray photoelectron spectroscopy (XPS) detection signals.

The measurement value may be a thickness of the film layer. The material(s) of the film layer may be determined based on frequency band(s) of the species signals.

Step 1340 may include at least one out of:

a. Determining the thickness of the film layer based on a value of a merit function (for example M), the value of the merit function is determined based on a difference between an actual attenuation of the film layer and a modeled attenuation of the film layer. The actual attenuation of the film layer may be represented by $$\frac{I_{SiO}}{I_{Si}},$$

whereas the modeled attenuation of the film layer may be represented by $$\frac{I_{SiO}^M}{I_{Si}^M}.$$

Various examples of the merit functions are provided above.

b. Determining the thickness of the film layer based on a value of a merit function, the value of the merit function is determined based on (i) the first film layer material species signals (for example—$I_{SiO}$), (ii) the substrate material species signals (for example—$I_{Si}$), (iii) the modeled first film layer material species signals (for example—$I_{SiO}^M$), and (iv) the modeled substrate material species signals (for example—$I_{Si}^M$).

c. Calculating the modeled first film layer material species signals based on the mixing information, a first film layer attenuation parameter (for example—$\lambda_{SiO}$) related to photoelectrons generated within the first film layer, the thickness of the film layer, and the first film layer material contribution value.

d. Calculating the substrate material species signals based on the mixing information, the thickness of the film layer, a first film layer attenuation parameter (for example—$\lambda_{si,SiO}$) related to photoelectrons generated within the substrate, and a substrate material contribution value (for example $K_{Si}$) that represents an effective contribution of the substrate material to at least one of the species signals.

The sample region may include a second film layer that is made of a second film layer material and is located outside the first sample sub-region. See for example—FIG. 7 that illustrates two film layers 715 and 735, we will assume that the second film layer is denoted 715.

In this case, step 1340 may include determining, based on the detection signals, second film layer material species signals in an energy band corresponding to electrons emitted from the second film layer material. The processor is also configured to determine a measurement value of the second film layer based on (i) the species signals, (ii) the mixing information, and (ii) a second film layer material contribution value that represent an effective contribution of the second film layer material to at least one of the species signals.

When there are two film layers that may be need to gather more information—as there are more unknown variables related to the two film layers. This may require performing one or more additional measurements. Step 1310 may be repeated and include illuminating, by the electron optics and with the X-ray spot, a second sample region that may include the second film layer and a second sample sub-region. Step 1320 may be repeated and may include detecting electrons emitted from the second sample region to provide detection signals.

FIG. 14 is a flow diagram illustrating a method 1400 according to one embodiment. Method 1400 may be performed by processing logic which may include software, hardware, or a combination thereof. For example, method 1400 may be performed by computer 205 of FIG. 2.

Method 1300 may start by step 1410 of obtaining detection signals that are indicative of electrons emitted from a first sample region as a result of an illumination, with a X-ray spot, the first sample region, wherein the first sample region comprises the first film layer and a first sample sub-region. The first film layer is made of a first film layer material and is positioned above a substrate that is made of a substrate material.

Step 1410 may be followed by step 1320 of detecting, by the electron optics, electrons emitted from the first sample region to provide detection signals.

Step 1320 may be followed by step 1330 of determining, by a processor, species signals based on the detection signals, the species signals may include (i) first film layer material species signals in an energy band corresponding to electrons emitted from the first film layer material, and (ii) substrate material species signals in an energy band corresponding to electrons emitted from the substrate material.

Step 1330 may be followed by step 1340 of determining, by the processor, a measurement value of the first film layer based on (i) the species signals, (ii) mixing information (for example—f) that is indicative of a fraction of the X-ray spot that impinges on the first film layer, and (ii) a first film layer material contribution value (for example $K_{SiO}$) that represents an effective contribution of the first film layer material to at least one of the species signals.

The detection signals may be X-ray photoelectron spectroscopy (XPS) detection signals.

The measurement value may be a thickness of the film layer. The material(s) of the film layer may be determined based on frequency band(s) of the species signals.

The sample region may include a second film layer that is made of a second film layer material and is located outside the first sample sub-region. See for example—FIG. 7 that illustrates two film layers 715 and 735, we will assume that the second film layer is denoted 715.

In this case, step 1340 may include determining, based on the detection signals, second film layer material species signals in an energy band corresponding to electrons emitted from the second film layer material. The processor is also configured to determine a measurement value of the second film layer based on (i) the species signals, (ii) the mixing information, and (ii) a second film layer material contribution value that represent an effective contribution of the second film layer material to at least one of the species signals.

When there are two film layers that may be need to gather more information—as there are more unknown variables related to the two film layers.

Step 1410 may be repeated and include obtaining detection signals that are indicative of electrons emitted from a second sample region as a result of an illumination, with a X-ray spot, the first sample region, wherein the second sample region comprises the second film layer and a second sample sub-region. The second film layer is made of a second film layer material and is positioned above the substrate that is made of the substrate material.

Step 1320 may be repeated and may include detecting electrons emitted from the second sample region to provide detection signals.

The detection signals may be regarded as being a weighted sum of a signal of interest (S) from the one or more film layers of interest and a signal (C) (also referred to as a spillage signal) from a spillage area (the area illuminated by the x-ray beam but outside the one or more film layers). The weight assigned to signal S is f and the weight assigned to C is 1−f.

There is a need to determine the value off and C—or f and S.

The spillage signal may be determined through knowledge of the semiconductor process provided by the manufacturer or measuring an area larger than the XPS spot size which may be located on an un-patterned part of the die. One other way to determine the spillage signal would be to scan the measurement area in a systematic way allowing a known quantity of spillage to vary in the measured data. See, for example FIGS. 8A and 8B. As the spot covers more of the contaminated area, the spillage signal will increase while the signal of interest decreases. By taking several points at different offsets from the center of the measurement pad, one could use this information to determine the contaminating signal. An additional method to determine the spillage signal would be to extrapolate the scan data to determine what the signal would be with zero spillage.

There are several methods to determine the coefficients mentioned above. One might float the coefficients in a regression routine. Another approach would be to fully characterize the power density across the XPS spot, but this may not be stable in time.

One other way would be to determine the amount of spillage using a well-characterized reference wafer sample—see, for example, FIG. 5.

Yet another manner to determine the weights may involve feed-forward, where a structural element is measured before the formation of the film layer and after the formation of the film layer—and the detection signals after the formation are compared to the detection signals after the formation—to provide an indication of the impact of the film layers on the detection signals—whereas the impact may provide an indication about the measurement value of the film layer. Assuming that C maintains the same before the formation and after the formation—it can be determined and removed from the detection signals.

The detection signals before formation may be used to normalize the detection signals after formation—as the detection signals before formation provide information regarding layers below the film layer.

Performing measurement before the formation and after the formation may provide a highly accurate evaluation of the measurement value—and may overcome inaccuracies in the formation of the structural element, differences between one evaluation system to another and even deviation over time of measurements.

Figure 15:
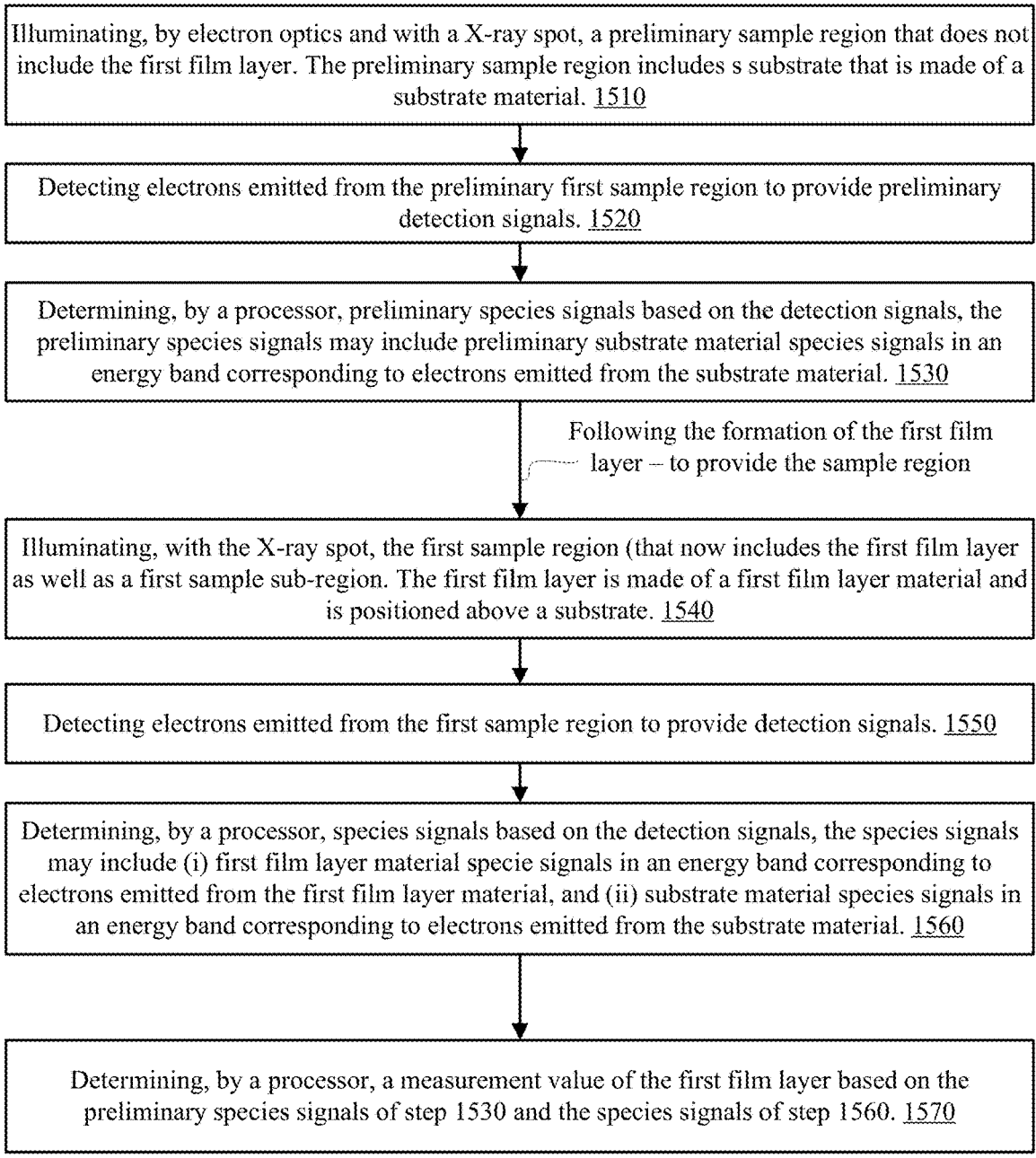
FIG. 15 is a flow diagram illustrating an example of a method.

FIG. 15 illustrates an example of method 1500 to characterize a first film layer of a sample.

Method 1500 may start by step 1510 of illuminating, with a X-ray spot, a preliminary first sample region—which is the first sample region before a formation of the first film layer within the first sample region. The preliminary first sample region may include a substrate and additional structural elements. The substrate is made of a substrate material.

Step 1510 may be followed by step 1520 of detecting electrons emitted from the preliminary first sample region to provide preliminary detection signals.

Step 1520 may be followed by step 1530 of determining, by a processor, preliminary species signals based on the detection signals, the preliminary species signals may include preliminary substrate material species signals in an energy band corresponding to electrons emitted from the substrate material.

The method may resume (in step 1540) after the formation of the first sample region that includes the film layer.

Step 1540 may include illuminating, with the X-ray spot, the first sample region (that now includes the first film layer as well as a first sample sub-region. The first film layer is made of a first film layer material and is positioned above a substrate.

Step 1540 may be followed by step 1550 of detecting electrons emitted from the first sample region to provide detection signals.

Step 1550 may be followed by step 1560 of determining, by a processor, species signals based on the detection signals, the species signals comprise (i) first film layer material species signals in an energy band corresponding to electrons emitted from the first film layer material, and (ii) substrate material species signals in an energy band corresponding to electrons emitted from the substrate material.

The determining, by the processor, of a measurement value of the first film layer based on the preliminary species signals of step 1530 and the species signals of step 1560. The determining may include determining the impact of the film layer based on the difference between the preliminary species signals and the species signals, and based on the difference determine the measurement value. This may include, for example, using variables such as the first film layer material contribution value and/or using any models mentioned above. For example—determining the thickness using the following equation:

$$I = \frac{1}{k}(1 - e^{-t/\sigma}),$$

where K is the standard k factor for producing photoelectrons of given species from a specific material, t is the thickness of the layer, and σ is the effective attenuation length for the material. It is assumed that k and σ are known.

According to another embodiment—the measurement value of the film layer may be determined using an effective material model, wherein the spillage signal is modeled as an effective substrate material. This effective substrate material is used as a variable of an modeled intensity equation—and the method include solving the modeled intensity equation. An example of a modeled intensity equation is provided below.

In a standard XPS film analysis, a thickness of sample may be determined by the following equation $$I = \frac{1}{k}(1 - e^{-t/\sigma}),$$

where K is the standard k factor for producing photoelectrons of given species from a specific material, t is the thickness of the layer, and σ is the effective attenuation length for the material.

The modeled intensity equation may be $$I = \frac{1}{k},$$

the k' factor for each species of interest is assumed to arise from a bulk substrate instead, and would be floated during a regression.

The value of k' can be determined by using X-ray spots of different radiuses to illuminate the structural element of interest. The X-ray spots of different radiuses should cover the entirety of the film layer but cover spillage areas of different areas. FIGS. 4A and 4B illustrate two X-ray spots of different radiuses—but in the determination of k' it may be beneficial that each of the first and second x-ray spots covers the entire film layer.

FIG. 17 illustrates an example of method 1700 to characterize a first film layer of a sample.

Method 1700 may start by step 1710 of illuminating, by electron optics and with a first X-ray spot of a first radius, a first sample region that includes the first film layer and a first sample sub-region. The first film layer is made of a first film layer material and is positioned above a substrate that is made of a substrate material.

Step 1710 may be followed by step 1720 of detecting, by the electron optics, electrons emitted from the first sample region to provide first detection signals.

Step 1720 may be followed by step 1730 of determining, by a processor, first species signals based on the first detection signals, the first species signals may include (i) first film layer material species signals in an energy band corresponding to electrons emitted from the first film layer material, and (ii) substrate material species signals in an energy band corresponding to electrons emitted from the substrate material.

Step 1730 is followed by step 1740 of illuminating, by electron optics and with a second X-ray spot of a second radius that differs from the first radius, a first sample region that includes the first film layer and a first sample sub-region.

Step 1740 may be followed by step 1750 of detecting, by the electron optics, electrons emitted from the first sample region to provide second detection signals.

Step 1750 may be followed by step 1760 of determining, by a processor, second species signals based on the second detection signals, the first species signals may include (i) first film layer material species signals in an energy band corresponding to electrons emitted from the first film layer material, and (ii) substrate material species signals in an energy band corresponding to electrons emitted from the substrate material.

Step 1760 is followed by step 1770 of determining, by the processor the measurement value of the first film layer based on the first species signals and the second species signals.

Figure 18:
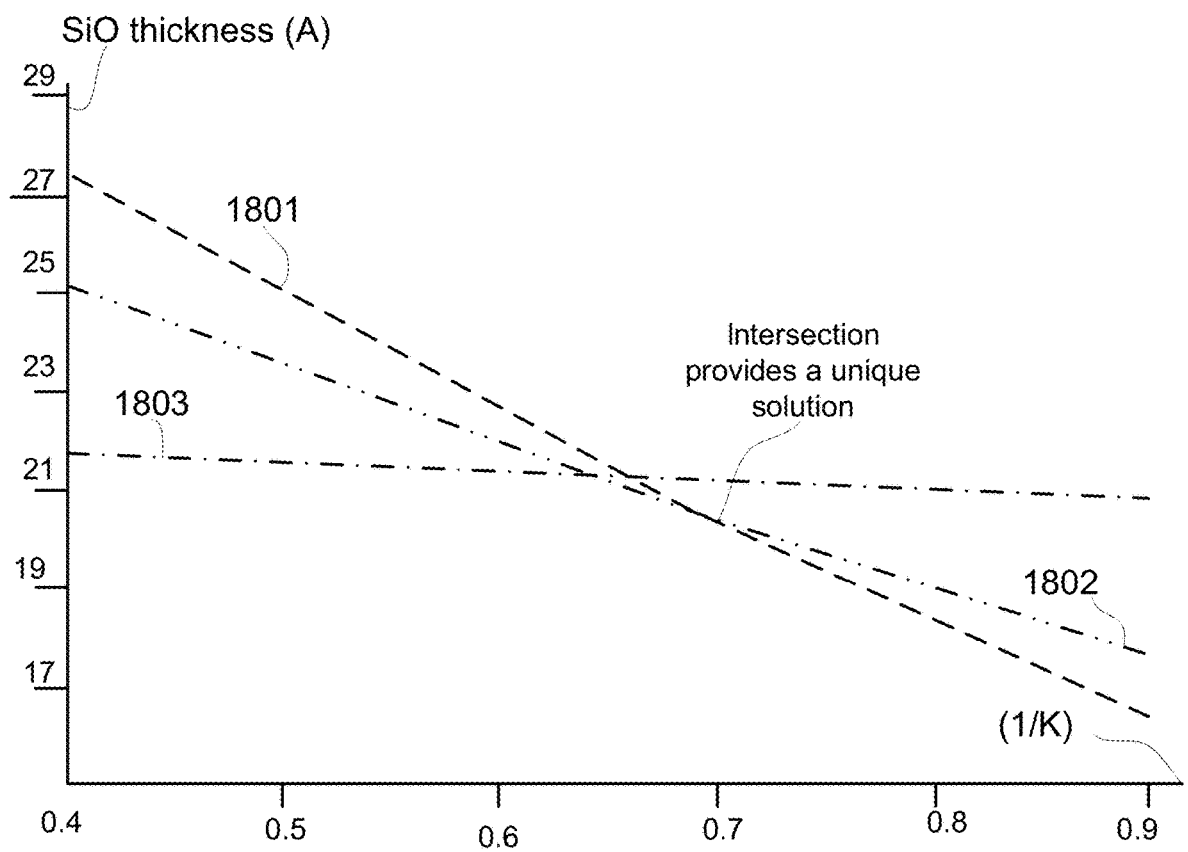
FIG. 18 is an example of a simulation of a thickness of a material.

FIG. 18 illustrates a simulation of a thickness of a material (of a film layer) as a function of the k' factor for multiple sized beams and pad sizes. The simulations of a SiO film thickness for three XPS measurements as a function of 1/k' is provided.

For a standard film analysis, 1/k' is known to be ~0.7 and would be used as an input to determine the SiO film thickness. The solution would be underdetermined if k would be allowed to vary.

The VFIV,f=0.57 (line 1801) and VFIII,f=7.05 (line 1802) curves show the effects on a 30 um measurement pad using a 50 um and 40 um spot, respectively, where the f is the fraction of the beam in the measurement pad. In the effective material model, we use two beam sizes with different amounts of contamination to uniquely define the solution. The intersection of these curves provides a unique solution for k, and thusly, the thickness. The VFIII,f=0.97 (line 1803) curve shows the relationship between k and thickness for a 50 um beam on a 50 um measurement pad, where the smaller spillage leads to less sensitivity to k'. These curves are merely to be used as descriptive tools since the algorithm would use a regression method to determine the k values for each species of interest.

There may be provided a non-transitory computer readable medium to characterize a first film layer of a sample, the non-transitory computer readable medium stores instructions that once executed by a computerized system cause the computerized system to execute the steps of method 1700.

There may be provided a non-transitory computer readable medium to characterize a first film layer of a sample, the non-transitory computer readable medium stores instructions that once executed by a computerized system cause the computerized system to execute the steps of method 1500.

There may be provided a non-transitory computer readable medium to characterize a first film layer of a sample, the non-transitory computer readable medium stores instructions that once executed by a computerized system cause the computerized system to execute the steps of method 1400.

There may be provided a non-transitory computer readable medium to characterize a first film layer of a sample, the non-transitory computer readable medium stores instructions that once executed by a computerized system cause the computerized system to execute the steps of method 1300.

A system to characterize a first film layer of a sample the system may be configured to execute method 1300.

A system to characterize a first film layer of a sample the system may be configured to execute method 1400.

A system to characterize a first film layer of a sample the system may be configured to execute method 1500.

A system to characterize a first film layer of a sample the system may be configured to execute method 1700.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation; a single operation may be distributed in additional operations and operations may be executed at least partially overlapping in time. Moreover, alternative embodiments may include multiple instances of an operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any reference to any of the terms "including", "comprising", "having" can be applied mutatis mutandis to the term "consisting" and/or "consisting essentially of".

It should be understood that processes and techniques described herein are not inherently related to any particular apparatus and may be implemented by any suitable combination of components. Further, various types of general purpose devices may be used in accordance with the teachings described herein. The present disclosure has been described in relation to particular examples, which are intended in all respects to be illustrative rather than restrictive. Those skilled in the art will appreciate that many different combinations will be suitable for practicing the present disclosure.

Moreover, other implementations of the disclosure will be apparent to those skilled in the art from consideration of the specification and practice of the disclosure disclosed herein. Notably, the expressions disclosed herein are provided as examples for the specific geometries of patterned layers as shown in the disclosed examples. Various aspects and/or components of the described embodiments may be used singly or in any combination. It is intended that the specification and examples be considered as exemplary only, with a true scope and spirit of the disclosure being indicated by the following claims.

We claim:

1. A system to characterize a first film layer of a sample the system comprising:
   electron optics that is configured to:
      illuminate, with a X-ray spot, a first sample region that comprises the first film layer and a first sample sub-region; wherein the first film layer is made of a first film layer material and is positioned above a substrate that is made of a substrate material; and detect electrons emitted from the first sample region to provide detection signals; and a processor that is configured to:

determine species signals based on the detection signals, the species signals comprise (i) first film layer material specie signals in an energy band corresponding to electrons emitted from the first film layer material, and (ii) substrate material species signals in an energy band corresponding to electrons emitted from the substrate material; and determine a measurement value of the first film layer based on (i) the species signals, (ii) mixing information that is indicative of a fraction of the X-ray spot that impinges on the first film layer, and (ii) a first film layer material contribution value that represents an effective contribution of the first film layer material to at least one of the species signals.

2. The system according to claim 1, wherein the detection signals are X-ray photoelectron spectroscopy (XPS) detection signals.

3. The system according to claim 1, wherein the detection signals are X-ray photoelectron spectroscopy (XPS) detection signals.

4. The system according to claim 1, wherein the measurement value is a thickness of the film layer.

5. The system according to claim 4, wherein the processor is configured to determine the thickness of the film layer based on a value of a merit function, the value of the merit function is determined based on a difference between an actual attenuation of the film layer and a modeled attenuation of the film layer.

6. The system according to claim 4, wherein the processor is configured to determine the thickness of the film layer based on a value of a merit function, the value of the merit function is determined based on (i) the first film layer material specie signals, (ii) the substrate material species signals; (iii) modeled first film layer material specie signals, and (iv) modeled substrate material species signals.

7. The system according to claim 6, wherein the modeled first film layer material specie signals are calculated based on the mixing information, a first film layer attenuation parameter related to photoelectrons generated within the first film layer, the thickness of the film layer, and the first film layer material contribution value.

8. The system according to claim 7, wherein the substrate material species signals are calculated based on the mixing information, the thickness of the film layer, a first film layer attenuation parameter related to photoelectrons generated within the substrate, and a substrate material contribution value that represents an effective contribution of the substrate material to at least one of the species signals.

9. The system according to claim 1, wherein the mixing information is indicative of a beam intensity distribution in relation to the one or more film layers.

10. The system according to claim 1, wherein the mixing information comprises one or more beam Gaussian parameters.

11. The system according to claim 1, wherein the film layer is positioned above an upper surface of the additional sample sub-region.

12. The system according to claim 1, wherein the film layer is positioned below an upper surface of the additional sample sub-region.

13. The system according to claim 1, wherein the sample region comprises a second film layer that is made of a second film layer material and is located outside the first sample sub-region;

wherein the processor is further configured to:

determine, based on the detection signals, second film layer material specie signals in an energy band corresponding to electrons emitted from the second film layer material;

determine a measurement value of the second film layer based on (i) the species signals, (ii) the mixing information, and (ii) a second film layer material contribution value that represent an effective contribution of the second film layer material to at least one of the species signals.

14. The system according to claim 13, wherein the electron optics is further configured to:

illuminate, with the X-ray spot, a second sample region that comprises the second film layer and a second sample sub-region; and detect electrons emitted from the second sample region to provide detection signals.

15. A method to characterize a first film layer of a sample, the method comprising:

illuminating, with a X-ray spot, a first sample region that comprises the first film layer and a first sample sub-region; wherein the first film layer is made of a first film layer material and is positioned above a substrate that is made of a substrate material;

detecting electrons emitted from the first sample region to provide detection signals; and determining, by a processor, species signals based on the detection signals, the species signals comprise (i) first film layer material specie signals in an energy band corresponding to electrons emitted from the first film layer material, and (ii) substrate material species signals in an energy band corresponding to electrons emitted from the substrate material; and determining, by the processor, a measurement value of the first film layer based on (i) the species signals, (ii) mixing information that is indicative of a fraction of the X-ray spot that impinges on the first film layer, and (ii) a first film layer material contribution value that represents an effective contribution of the first film layer material to at least one of the species signals.

16. A non-transitory computer readable medium to characterize a first film layer of a sample, the non-transitory computer readable medium stores instructions that once executed by a computerized system cause the computerized system to execute the steps of:

illuminating, with a X-ray spot, a first sample region that comprises the first film layer and a first sample sub-region; wherein the first film layer is made of a first film layer material and is positioned above a substrate that is made of a substrate material;

detecting electrons emitted from the first sample region to provide detection signals; and determining, by a processor, species signals based on the detection signals, the species signals comprise (i) first film layer material specie signals in an energy band corresponding to electrons emitted from the first film layer material, and (ii) substrate material species signals in an energy band corresponding to electrons emitted from the substrate material; and determining, by the processor, a measurement value of the first film layer based on (i) the species signals, (ii) mixing information that is indicative of a fraction of the X-ray spot that impinges on the first film layer, and (ii) a first film layer material contribution value that represents an effective contribution of the first film layer material to at least one of the species signals.

17. A method to characterize a first film layer of a sample, the method comprising:

obtaining detection signals that are indicative of electrons emitted from a first sample region as a result of an illumination, with a X-ray spot, the first sample region, wherein the first sample region comprises the first film layer and a first sample sub-region; wherein the first film layer is made of a first film layer material and is positioned above a substrate that is made of a substrate material;

determining, by a processor, species signals based on the detection signals, the species signals comprise (i) first film layer material specie signals in an energy band corresponding to electrons emitted from the first film layer material, and (ii) substrate material species signals in an energy band corresponding to electrons emitted from the substrate material; and determining, by the processor, a measurement value of the first film layer based on (i) the species signals, (ii) mixing information that is indicative of a fraction of the X-ray spot that impinges on the first film layer, and (ii) a first film layer material contribution value that represents an effective contribution of the first film layer material to at least one of the species signals.

* * * * *